US012068404B2

(12) United States Patent
Shoji et al.

(10) Patent No.: US 12,068,404 B2
(45) Date of Patent: Aug. 20, 2024

(54) SEMICONDUCTOR DEVICE AND SEMICONDUCTOR MODULE

(71) Applicant: FUJI ELECTRIC CO., LTD., Kanagawa (JP)

(72) Inventors: Atsushi Shoji, Matsumoto (JP); Soichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 18/472,259

(22) Filed: Sep. 22, 2023

(65) Prior Publication Data

US 2024/0030324 A1 Jan. 25, 2024

Related U.S. Application Data

(63) Continuation of application No. 17/159,093, filed on Jan. 26, 2021, now Pat. No. 11,777,020, which is a
(Continued)

(30) Foreign Application Priority Data

Feb. 7, 2019 (JP) .................................. 2019-020982
Jun. 18, 2019 (JP) .................................. 2019-112962

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0607* (2013.01); *H01L 29/41708* (2013.01); *H01L 29/861* (2013.01)

(58) Field of Classification Search
CPC ............ H01L 29/7397; H01L 29/0607; H01L 29/41708; H01L 29/861
(Continued)

(56) References Cited

U.S. PATENT DOCUMENTS 4,593,302 A 6/1986 Lidow
5,170,241 A 12/1992 Yoshimura
(Continued)

FOREIGN PATENT DOCUMENTS

EP 0671769 A2 9/1995
JP S57109376 A 7/1982
(Continued)

OTHER PUBLICATIONS

International Search Report and (ISA/237) Written Opinion of the International Search Authority for International Patent Application No. PCT/JP2019/04597, mailed by the Japan Patent Office on Mar. 3, 2020.
(Continued)

*Primary Examiner* — Igwe U Anya

(57) ABSTRACT

Provided is a semiconductor device including: a semiconductor substrate; an active portion provided on the semiconductor substrate; a first well region and a second well region arranged sandwiching the active portion in a top view, provided on the semiconductor substrate; an emitter electrode arranged above the active portion; and a pad arranged above the first well region, away from the emitter electrode, wherein the emitter electrode is provided above the second well region. The provided semiconductor device further includes a peripheral well region arranged enclosing the active portion in a top view, wherein the first well region and the second well region may protrude to the center side of the active portion rather than the peripheral well region.

20 Claims, 20 Drawing Sheets

Related U.S. Application Data continuation of application No. PCT/JP2019/047279, filed on Dec. 3, 2019.

(51) Int. Cl.
*H01L 29/417* (2006.01)
*H01L 29/861* (2006.01)

(58) Field of Classification Search
USPC .......................................................... 257/140
See application file for complete search history.

(56) References Cited

U.S. PATENT DOCUMENTS

| | | | |
|---|---|---|---|
| 5,306,937 | A | 4/1994 | Nishimura |
| 6,180,966 | B1 | 1/2001 | Kohno |
| 2015/0031208 | A1 | 1/2015 | Shitomi |
| 2015/0155277 | A1 | 6/2015 | Ogura |
| 2015/0262813 | A1 | 9/2015 | Kishida |
| 2016/0260703 | A1 | 9/2016 | Nakamura |
| 2017/0084610 | A1 | 3/2017 | Kouno |
| 2017/0110545 | A1* | 4/2017 | Nagao ................. H01L 29/0619 |
| 2017/0133227 | A1 | 5/2017 | Kajiwara |
| 2018/0166549 | A1 | 6/2018 | Kato |
| 2018/0182844 | A1 | 6/2018 | Nakamura |
| 2018/0226400 | A1 | 8/2018 | Shinsho |
| 2019/0096989 | A1* | 3/2019 | Yoshida ............... H01L 27/0761 |
| 2019/0252534 | A1 | 8/2019 | Murakawa |
| 2021/0151429 | A1* | 5/2021 | Obata ................. H01L 29/4238 |
| 2021/0265340 | A1* | 8/2021 | Mitsuzuka .......... H01L 27/0664 |

FOREIGN PATENT DOCUMENTS

| | | |
|---|---|---|
| JP | H0575131 A | 3/1993 |
| JP | 2007329330 A | 12/2007 |
| JP | 2009038140 A | 2/2009 |
| JP | 2015026683 A | 2/2015 |
| JP | 2015177116 A | 10/2015 |
| JP | 2017183530 A | 10/2017 |
| JP | 2018073911 A | 5/2018 |
| JP | 2018093209 A | 6/2018 |
| WO | 2018038133 A1 | 3/2018 |
| WO | 2018110703 A1 | 6/2018 |

OTHER PUBLICATIONS

Extended European Search Report for European Patent Application No. 19914593.9, issued by the European Patent Office on Dec. 1, 2021.
Those references were submitted as IDS or found by the examiner over the earlier U.S. Appl. No. 17/159,093, filed Jan. 26, 2021.

\* cited by examiner

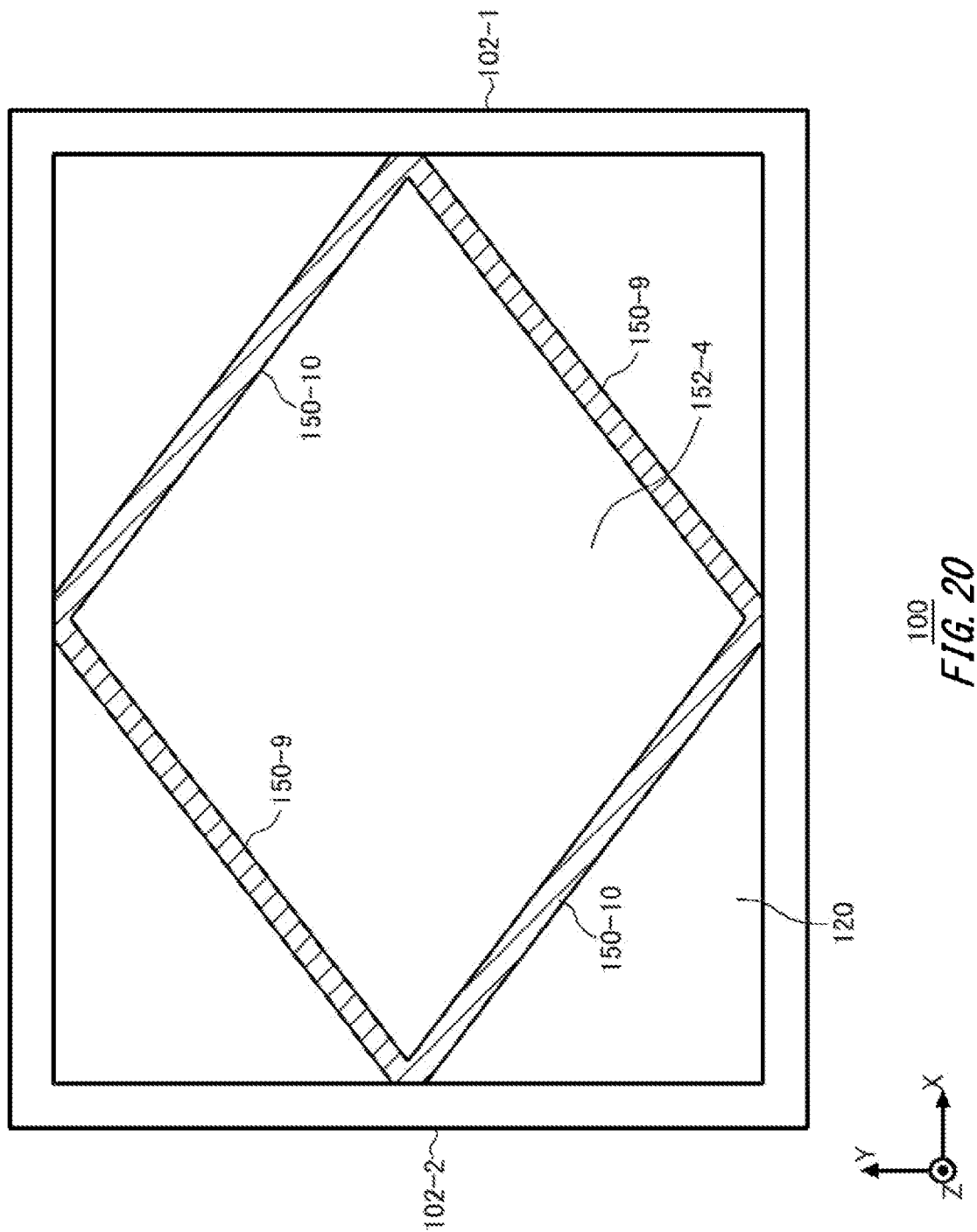

SEMICONDUCTOR DEVICE AND SEMICONDUCTOR MODULE

CROSS-REFERENCE TO RELATED APPLICATIONS

This application is a continuation of U.S. patent application Ser. No. 17/159,093 filed on Jan. 26, 2021, which is a continuation of International Patent Application PCT/JP2019/047279 filed on Dec. 3, 2019; which claims priority to Japanese Patent Applications NO. 2019-020982 filed on Feb. 7, 2019 and NO. 2019-112962 filed on Jun. 18, 2019, the entirety of the contents of each of which are hereby incorporated herein by reference.

BACKGROUND

1. Technical Field

The present invention relates to a semiconductor device and a semiconductor module.

2 Related Art

Conventionally, semiconductor devices provided with sensors for detecting chip temperature or the like are known (see Patent Document 1, for example). Also, semiconductor devices have been known with protective films provided of polyimide and so on (refer to Patent Document 2-4, for example).

Patent document 1: Japanese Unexamined Patent Application, Publication No. 2007-329330
Patent document 2: Japanese Unexamined Patent Application, Publication No. 2009-38140
Patent document 3: Japanese Unexamined Patent Application, Publication No. 2015-177116
Patent document 4: Japanese Unexamined Patent Application, Publication No. 2015-26683 Semiconductor devices are preferably easy to assemble.

GENERAL DISCLOSURE

To solve the above problems, a first aspect of the present invention provides a semiconductor device including a semiconductor substrate. The semiconductor device may include an active portion provided on the semiconductor substrate. The semiconductor device may include a first well region and a second well region provided in the semiconductor substrate and arranged sandwiching the active portion in a top view. The semiconductor device may include an emitter electrode arranged above the active portion. The semiconductor device may include a pad arranged away from the emitter electrode, and above the first well region. The emitter electrode may be arranged above the second well region.

The semiconductor device may include a peripheral well region arranged enclosing the active portion in a top view. The first well region and the second well region may protrude to the center side of the active portion rather than the peripheral well region.

The semiconductor substrate may have a first end side and a second end side facing each other in a top view. The first well region may be arranged between the active portion and the first end side. The second well region may be arranged between the active portion and the second end side.

The semiconductor device may include a transistor portion arranged in the active portion, and a dummy element portion arranged enclosed by the second well region in a top view. Both of the transistor portion and the dummy element portion may include gate trench portions provided on an upper surface of the semiconductor substrate. The transistor portion may have a first conductivity type emitter region provided in contact with the gate trench portion on the upper surface of the semiconductor substrate. A second conductivity type region may be provided in a region in contact with the gate trench portion on an upper surface of the dummy element portion.

The area of the dummy element portion may be smaller than the area of the transistor portion in a top view.

The second conductivity type region of the dummy element portion may be electrically connected to the emitter electrode.

The gate trench portion may have a longitudinal length in a predetermined trench longitudinal direction on the upper surface of the semiconductor substrate. The second conductivity type region of the dummy element portion may have a second conductivity type contact region with a higher doping concentration than the base region, where the second conductivity type base region and the base region are alternately arranged along the trench longitudinal direction.

Semiconductor device may include a dividing well region for dividing the active portion in a top view. The dividing well region may have a longitudinal length in a predetermined well longitudinal direction. The dividing well region may have a wide portion with a width wider than other portions in the direction perpendicular to the well longitudinal direction in a top view. The emitter electrode may be arranged above the wide portion.

The emitter electrode may cover the whole of the wide portion.

The wide portion may be arranged between the first well region and the second well region in a top view.

The dividing well region may be provided from the first well region to the second well region in a top view.

A gate pad may be provided above the first well region. The semiconductor device may include a gate runner connected to the gate pad. The gate runner may have a portion provided in along the end side of the second well region in a top view. The gate runner may have a portion provided along the end side of the wide portion in a top view.

The semiconductor device may include a protective layer provided above the emitter electrode. The protective layer may divide the upper surface of the semiconductor substrate into a first region with a first well region provided, a second region with a second well region provided, and a third region between the first well region and the second well region.

The third region may have a larger area than any of the first region and the second region in a top view.

The semiconductor device may include a connecting portion connected to a region of the emitter electrode, which is not covered by the protective layer. The connecting portion may be connected to the third region.

The protective layer may include first beam portions where the first direction is the longitudinal direction, and second beam portions where the second direction, different from the first direction, is the longitudinal direction. In a top view, each beam portion may be sandwiched between the emitter electrode that is not covered by the protective layer in the lateral direction orthogonal to the respective longitudinal direction.

The third region of the emitter electrode may be enclosed by the protective layer including at least one of the first beam portions and at least one of the second beam portions.

A second aspect of the present invention provides a semiconductor device including a semiconductor substrate. The semiconductor device may include an active portion provided on the semiconductor substrate. The semiconductor device may include a transistor portion arranged in the active portion. The semiconductor device may include a dummy element portion. The semiconductor device may include a well region for separating the transistor portion and the dummy element portion. Both of the transistor portion and the dummy element portion may include a gate trench portion provided on the upper surface of the semiconductor substrate. The transistor portion may have a first conductivity type emitter region provided in contact with the gate trench portion on the upper surface of the semiconductor substrate. A second conductivity type region may be provided in the region in contact with the gate trench portion on the upper surface of the dummy element portion.

A third aspect of the present invention provides a semiconductor device including a semiconductor substrate. The semiconductor device may include an active portion provided on the semiconductor substrate. The semiconductor device may include an emitter electrode arranged above the active portion. The semiconductor device may include a dividing well region for dividing the active portion in a top view. The dividing well region may have a longitudinal length in a predetermined well longitudinal direction. The dividing well region may have a wide portion with a width in the direction perpendicular to the well longitudinal direction wider than other portions in a top view. The emitter electrode may be arranged above the wide portion.

A fourth aspect of the present invention provides a semiconductor module including a first semiconductor device and a second semiconductor device. The first semiconductor device may be the semiconductor device of the first aspect. The second semiconductor device may include a semiconductor substrate. The second semiconductor device may include an active portion provided on the semiconductor substrate. The second semiconductor device may include a first well region and a second well region provided on the semiconductor substrate and arranged sandwiching the active portion in a top view. The second semiconductor device may include an emitter electrode arranged above the active portion. The second semiconductor device may include a first pad arranged above the first well region, and separated from the emitter electrode. The second semiconductor device may include a second pad arranged above the second well region, separated from the emitter electrode.

A fifth aspect of the present invention provides a semiconductor device including a semiconductor substrate. The semiconductor device may include an emitter electrode arranged above the semiconductor substrate. The semiconductor device may include a protective layer provided above the emitter electrode. The semiconductor device may include a connecting portion connected to a region of the emitter electrode, which is not covered by the protective layer. The protective layer may divide the upper surface of the emitter electrode into a plurality of regions. Among the plurality of regions of the emitter electrode, an area of a connecting region to which the connecting portion connects may be a largest area.

The protective layer may include a first beam portion where the first direction is the longitudinal direction, and a second beam portion where the second direction is the longitudinal direction, different from the first direction. In a top view, each beam portion may be sandwiched between the emitter electrode that is not covered by the protective layer in the lateral direction orthogonal to the respective longitudinal direction.

The connecting region of the emitter electrode may be enclosed by the protective layer including at least one of the first beam portions and at least one of the second beam portions.

The semiconductor device may include a pad provided away from the emitter electrode, above the semiconductor substrate. The protective layer may have an electrode separating portion provided between the emitter electrode and the pad in a top view. Each of the width of the first beam portions in the lateral direction and the width the second beam portions in the lateral direction may be greater than the width of the electrode separating portion.

At least one of the first beam portions and the second beam portions may be arranged on the upper surface of the emitter electrode.

The semiconductor device may include a diode portion that has a first conductivity type cathode region in contact with the lower surface of the semiconductor substrate. The semiconductor device may include a transistor portion that has a second conductivity type collector region in contact with the lower surface of the semiconductor substrate. The diode portion may have a lifetime adjustment region for adjusting lifetime of the carrier on the upper surface side of the semiconductor substrate. The first beam portion may be provided in a position that does not overlap the cathode region.

The first direction of the transistor portion may be the longitudinal direction. The first beam portion may be provided above the transistor portion.

The protective layer may be provided in a position does not overlap the cathode region.

A sixth aspect of the present invention provides a semiconductor device including a semiconductor substrate. The semiconductor device may include an emitter electrode arranged above the semiconductor substrate. The semiconductor device may include a protective layer provided above the emitter electrode. The semiconductor device may include a diode portion that has a first conductivity type cathode region in contact with the lower surface of the semiconductor substrate. The semiconductor device may include a transistor portion that has a second conductivity type collector region in contact with the lower surface of the semiconductor substrate. The protective layer may be provided in a position does not overlap with the cathode region.

The summary clause does not necessarily describe all necessary features of the embodiments of the present invention. The present invention may also be a sub-combination of the features described above.

BRIEF DESCRIPTION OF THE DRAWINGS

FIG. 20 illustrates a top view of another exemplary arrangement of the protective layer 150.

DESCRIPTION OF EXEMPLARY EMBODIMENTS

Figure 1:
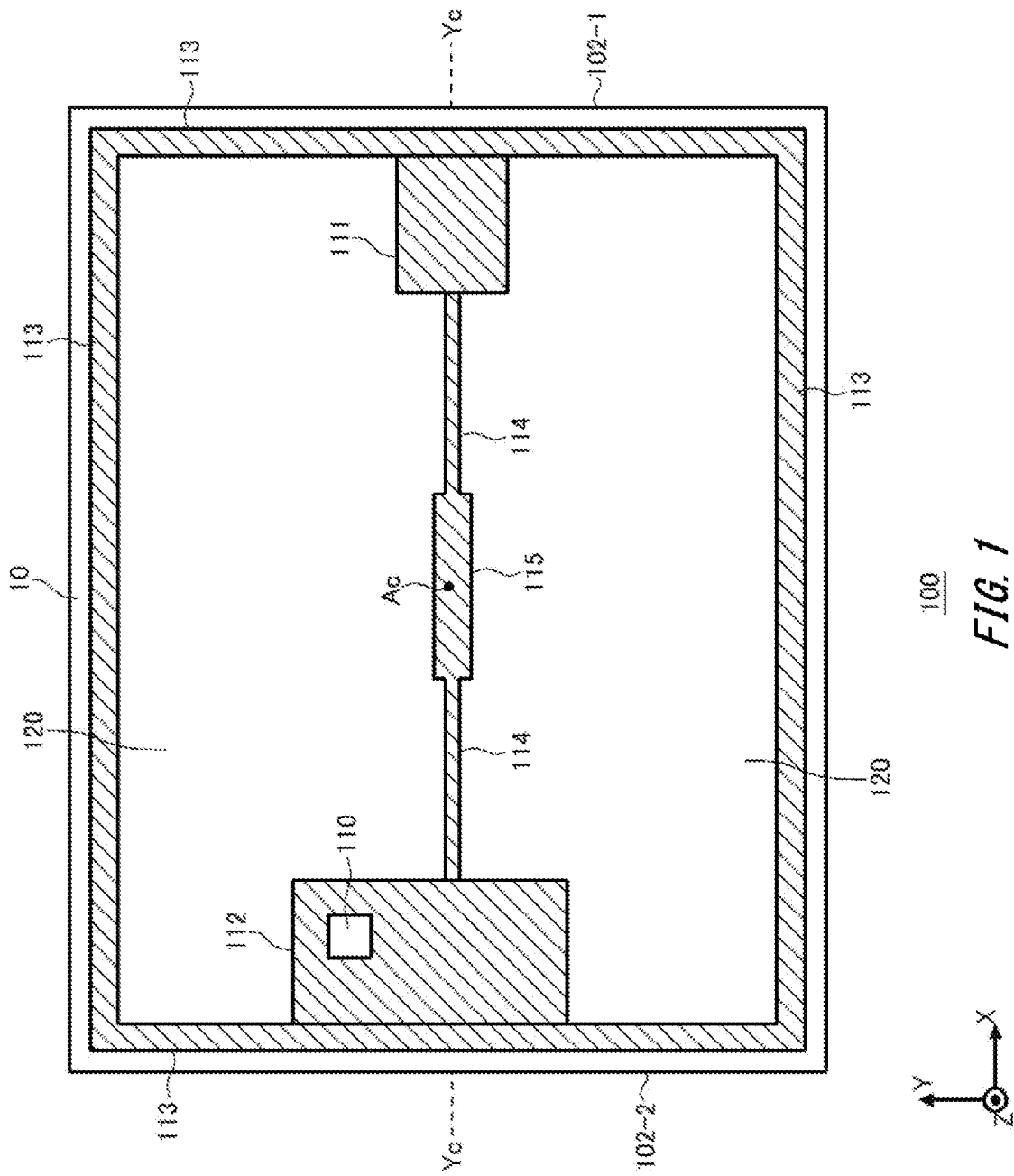
FIG. 1 illustrates a top view of one example of a semiconductor device 100 according to one embodiment of the present invention.

Hereinafter, the present invention will be described with reference to embodiments of the invention. However, the following embodiments shall not be construed as limiting the claimed invention. Also, not all combinations of features described in the embodiments are essential for means to solve problems provided by aspects of the invention.

In this specification, one side of the semiconductor substrate in the direction parallel to the depth direction is referred to as "upper" and the other side is referred to as "lower". Of the two principal surfaces of the substrate, layer or other members, one surface is referred to as the upper surface and the other surface is referred to as the lower surface. The directions of "upper" and "lower" are not limited to the direction of gravity or the direction in which the semiconductor device is mounted.

In this specification, the orthogonal coordinate axes of the X, Y and Z axes may be used to describe technical matters. The orthogonal coordinate axes only identify the relative positions of the components and do not limit the specific direction. For example, the Z axis is not limited to a height direction with respect to the ground. Additionally, the +Z axis direction and the −Z axis direction are opposite directions to each other. When described as the Z axis direction without describing positive or negative, it means that the direction is parallel to the +Z and −Z axes. And in this specification, viewing from the +Z axis direction may be referred to as a top view.

In this specification, when referred to as "same" or "equal", it may also include cases with errors due to manufacturing variation and the like. The errors are, for example, within 10%.

In this specification, the conductivity type of the doping regions doped with impurities is described as P type or N type. However, the conductivity type of each doping region may also be of the opposite polarity. Also, in this specification, when described as P+ type or N+ type, it means the doping concentration is higher than P type or N type; when described as P− type or N− type, it means the doping concentration is lower than P type or N type.

In this specification, the doping concentration refers to the concentration of impurities activated as the donor or acceptor. In this specification, the concentration difference of the donor and acceptor may be the higher concentration of the donor or acceptor. The concentration difference in this case can be measured by voltage-capacitance measurement method (CV method). Also, the carrier concentration measured by spreading resistance measurement method (SR) may be the concentration of the donor or acceptor. Also, when there is a peak in concentration distribution of the donor or acceptor, the peak value in this case may be the concentration of the donor or acceptor in the region. In the case such as the concentration of the donor or acceptor is approximately uniform in a region where the donor or acceptor exists, the average value of the concentration of the donor or acceptor in the region may be the concentration of the donor or acceptor.

FIG. 1 illustrates a top view of one example of a semiconductor device 100 according to one embodiment of the present invention. The semiconductor device 100 includes a semiconductor substrate 10. The semiconductor substrate 10 is a substrate formed of semiconductor materials such as silicon or compound semiconductors. The semiconductor substrate 10 has an end side 102 in a top view. The semiconductor substrate 10 of this example has two sets of end sides 102 facing each other in a top view. FIG. 1 illustrates one set of a first end side 102-1 and a second end side 102-2 facing each other. In FIG. 1, the direction parallel to the first end side 102-1 and the second end side 102-2 is the Y axis direction and the direction perpendicular to the first end side 102-1 and the second end side 102-2 is the X axis direction.

On the semiconductor substrate 10, an active portion 120 is provided. The active portion 120 is the region where a main current flows in the depth direction between the upper surface and the lower surface of the semiconductor substrate 10, when the semiconductor device 100 is controlled to the on state. Accordingly, in FIG. 1, a region inside the well region illustrated by diagonal lines may be the active portion 120. In the active portion 120, a transistor portion including transistor elements such as IGBTs (insulated gate bipolar transistors) may be provided. In the active portion 120, a diode portion including diode elements such as FWDs (freewheeling diodes) may also be provided. The active portion 120 may be a region provided with at least one of the transistor portion and the diode portion.

On the semiconductor substrate 10, a P type well region is provided. The well region is a region having a higher doping concentration than the base region described below, and formed in contact with the upper surface of the semiconductor substrate 10, and formed to a position deeper than the bottom portion of the base region. The depth in this case is the depth with the upper surface of the semiconductor substrate 10 as the reference position. FIG. 1 illustrates an exemplary arrangement of the well region on the upper surface of the semiconductor substrate 10. In FIG. 1, the well region is hatched with diagonal lines.

The well region is a relatively high-concentration P type region, which makes it difficult for an electron current to flow. Thus, if the well region is unevenly arranged, the region in which an electron current is difficult to flow will be biased. In the semiconductor device 100 in this example, the well region in a top view is arranged in well-balance, thus the region in which an electron current is difficult to flow is arranged in well-balance. In this way, by suppressing the bias of the electron current, the withstand capability of the semiconductor device 100 can be improved.

The semiconductor device 100 has a first well region 111 and a second well region 112. The first well region 111 and the second well region 112 are arranged sandwiching the active portion 120 in a top view. The first well region 111 and the second well region 112 are arranged sandwiching the active portion 120 in a predetermined direction (the X axis direction in FIG. 1). The two well regions sandwiching the active portion 120 refers to either straight line connecting the two well regions passing through the active portion 120 in a top view.

The first well region 111 may be arranged near the first end side 102-1. That is, the distance between the first well region 111 and the first end side 102-1 is less than the distance between the first well region 111 and the second end side 102-2. The second well region 112 may be arranged near the second end side 102-2. That is, the distance between the second well region 112 and the second end side 102-2 is less than the distance between the second well region 112 and the first end side 102-1.

The first well region 111 in this example is arranged between the active portion 120 and the first end side 102-1 in the X axis direction. The active portion 120 is not provided between the first well region 111 and the first end side 102-1. That is, the first well region 111 is arranged between one end of the active portion 120 in the X axis direction and the first end side 102-1.

The second well region 112 in this example is arranged between the active portion 120 and the second end side 102-2 in the X axis direction. The active portion 120 is not provided between the second well region 112 and the second end side 102-2. That is, the second well region 112 is arranged between the end of the active portion 120 in the X axis direction and the second end side 102-2.

The first well region 111 and the second well region 112 may be provided in the range including the center positions Yc of the first end side 102-1 and the second end side 102-2 in the Y axis direction. The first well region 111 may be sandwiched by the active portion 120 in the Y axis direction. The second well region 112 may be sandwiched by the active portion 120 in the Y axis direction. The second well region 112 may be provided in a wider range in the Y axis direction than the first well region 111.

The second well region 112 may also enclose a predetermined region in a top view. The second well region 112 in this example encloses the dummy element portion 110 provided on the semiconductor substrate 10. The dummy element portion 110 will be described below.

The semiconductor device 100 may have a peripheral well region 113 arranged enclosing the active portion 120 in a top view. The peripheral well region 113 may be provided parallel to each end side of the semiconductor substrate 10. The peripheral well region 113 in this example is a circular region enclosing the active portion 120 in a top view. The peripheral well region 113 may have a constant width in the direction perpendicular to each end side.

The first well region 111 and the second well region 112 in this example protrude more to the center Ac side of the active portion 120 than the peripheral well region 113. The center Ac of the active portion 120 is the geometric center of gravity of the active portion 120 in a top view. In other examples, at least one of the first well region 111 and the second well region 112 may also be arranged between the peripheral well region 113 and the end side 102 of the semiconductor substrate 10. In this case, the first well region 111 and the second well region 112 protrude from the peripheral well region 113 to the end side 102.

The semiconductor device 100 may have a dividing well region 114 for dividing the active portion 120 in a top view. The active portion 120 may have two or more regions divided by the well regions including the dividing well region 114. The dividing well region 114 has a longitudinal length in a predetermined well longitudinal direction. The dividing well region 114 extends along the well longitudinal direction and traverses the active portion 120. In FIG. 1, the well longitudinal direction is the X axis direction.

The dividing well region 114 may be provided between the first well region 111 and the second well region 112. The dividing well region 114 may have one end of the longitudinal direction connected to the first well region 111, and the other end connected to the second well region 112. The dividing well region 114 may be provided in the region that overlaps the center Ac of the active portion 120.

The dividing well region 114 may have a wide portion 115 with a width in the direction perpendicular to the well longitudinal direction (the Y axis direction in this example) that is wider than other portions in a top view. The wide portion 115 is also provided between the first well region 111 and the second well region 112. The wide portion 115 may be provided in the region that overlaps the center Ac of the active portion 120. The wide portion 115 may also be arranged in the region including the center of the well longitudinal direction of the dividing well region 114.

Figure 2:
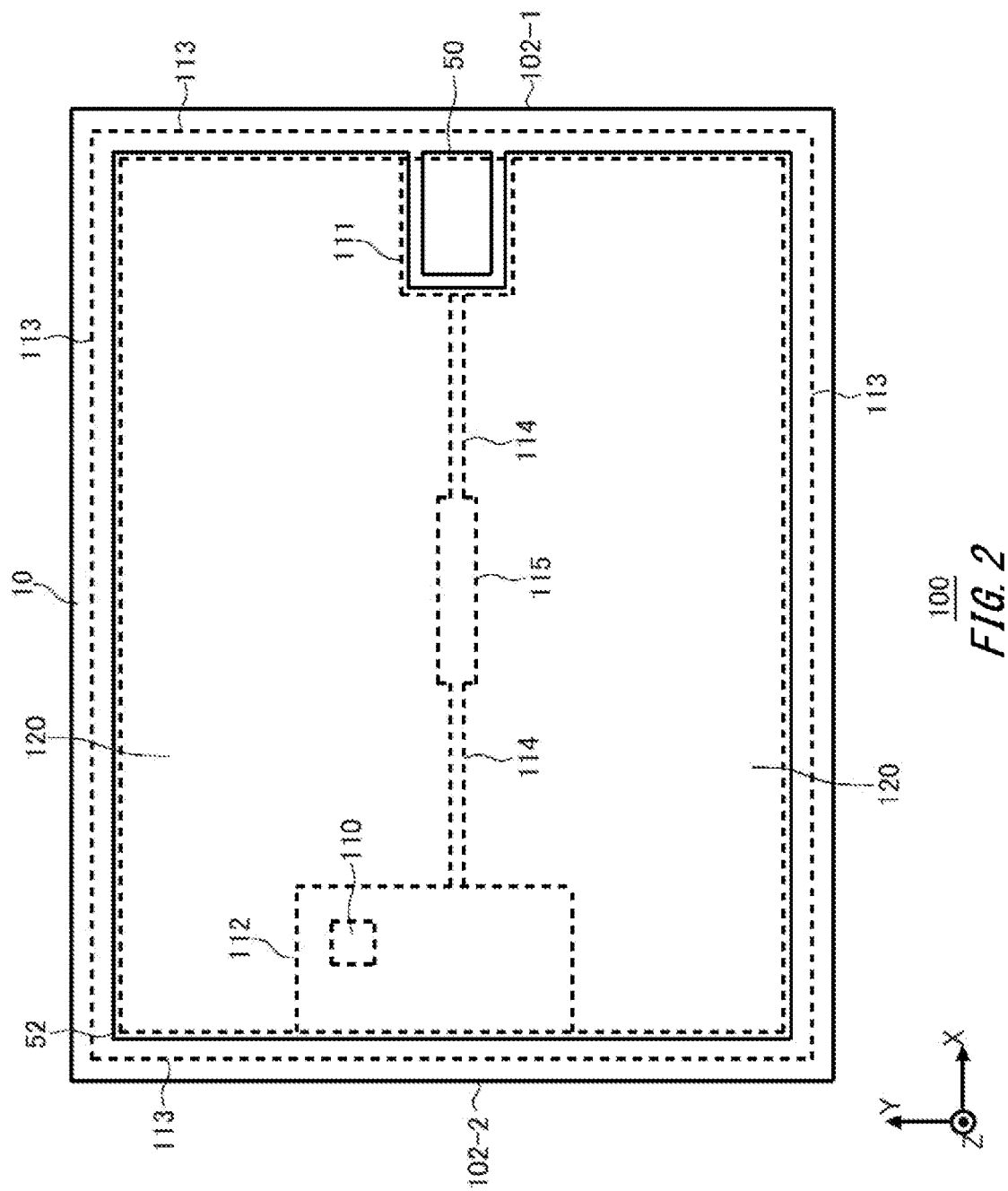
FIG. 2 illustrates an emitter electrode 52 and a pad 50 arranged above the semiconductor substrate 10.

FIG. 2 illustrates an emitter electrode 52 and a pad 50 arranged above the semiconductor substrate 10. In FIG. 2, each well region illustrated in FIG. 1 is illustrated by dashed lines. The emitter electrode 52 and the pad 50 are illustrated by solid lines. The emitter electrode 52 and pad 50 are electrodes containing metals such as aluminum. An insulating film is provided between the emitter electrode 52 and the pad 50, and the semiconductor substrate 10. The emitter electrode 52 and the pad 50, and the semiconductor substrate 10 are connected via contact holes provided on the insulating film. In FIG. 2, the illustration of the insulating film and the contact holes is omitted.

The emitter electrode 52 is arranged above the active portion 120. The emitter electrode 52 is connected to the active portion 120 via the contact holes described above. To the upper surface of the emitter electrode 52, wires, lead frames or the like are connected, and a predetermined emitter voltage is applied. The pad 50 is, for example, a gate pad. The emitter electrode 52 and the pad 50 are provided separated from each other in a top view. To the upper surface of the pad 50, wires and so on are connected, and a predetermined gate voltage is applied. The gate voltage applied to the pad 50 is supplied to the transistor portion of the active portion 120, by the gate runner or the like that is described below.

The pad 50 is arranged above the first well region 111. That is, at least a part of the pad 50, and at least a part of the first well region 111 are overlapped. Half or more of the region of the pad 50 of this example overlaps the first well region 111 in a top view. The gate pad 50 may also wholly overlap the first well region 111. Each pad of the semiconductor device is preferably arranged above the well region.

An emitter electrode 52 is arranged above the second well region 112. The emitter electrode 52 above the second well region 112, and the emitter electrode 52 above the active portion 120, are provided continuously without separating from each other. Half or more of the region may be covered by the emitter electrode 52, and may also be wholly covered by the second well region 112. Additionally, the emitter electrode 52 may also be arranged above the dummy element portion 110. The dummy element portion 110 may be wholly covered by the emitter electrode 52.

An emitter electrode 52 may also be arranged above the peripheral well region 113. That is, the emitter electrode 52 above the active portion 120 is arranged extending up above the peripheral well region 113. The peripheral well region 113 may have a region that is not covered by the emitter electrode 52.

The emitter electrode 52 may also be arranged above the wide portion 115. The wide portion 115 may be wholly covered by the emitter electrode 52. The dividing well region 114 may also be wholly covered by the emitter electrode 52.

As a semiconductor device, a configuration including a current sensor for detecting the current flowing between the upper surface and the lower surface of the semiconductor substrate is known. For example, a current sensor is provided in a region corresponding to the dummy element portion 110 of the semiconductor device 100. The current sensor has the same structure with the transistor portion of the semiconductor substrate, and simulates the operations of the transistor portion. The current flowing through the transistor portion can be estimated by detecting the current flowing through the current sensor. A pad for the current sensor is provided in the semiconductor device. The pad for the current sensor may be arranged in the region corresponding to the second well region 112 of this example. Also, a pad such as a gate pad is arranged in the region corresponding to the first well region 111.

The well regions under each pad are arranged facing each other in a top view. As the well region is a region in which a current does not flow easily, by arranging the well regions to face each other, the regions in which a current does not flow easily can be arranged in well-balance on the semiconductor substrate. Thus, the withstand capability of the semiconductor device can be improved.

A pad for the current sensor is not provided above the second well region 112 of the semiconductor device 100 of this example. Thereby, although the estimation of the flowing current inside the transistor portion of the semiconductor device 100 becomes difficult, as the wiring or the like to the pad for the current sensor is no more needed, the assembly of the semiconductor device 100 becomes easier. Accordingly, the manufacturing cost can be reduced.

An emitter electrode 52 is arranged above the second well region 112. The dummy element portion 110 may be connected with the emitter electrode 52. The dummy element portion 110 is a region in which, for example, a gate trench portion described below is provided, but an emitter region is not provided. That is, the dummy element portion 110 is a region in which a gate trench portion is provided, but not operating as a transistor.

In a semiconductor device in which the dummy element portion 110 is operated as a current sensor, the pad for the current sensor and the emitter electrode are separated. Thus, the current from the current sensor does not flow inside the emitter electrode directly. In the semiconductor device 100 of this example, by not operating the dummy element portion 110 as a transistor portion, the current from the dummy element portion 110 is not supplied directly to the emitter electrode 52. Accordingly, in the semiconductor device that operates the dummy element portion 110 as a current sensor, and in the semiconductor device 100 of this example, the main current flowing to the emitter electrode 52 can be equalized. Thus, even if concomitantly using the two types of semiconductor devices, the variation of the main current can be suppressed. Also, by providing the gate trench portion in the dummy element portion 110, the gate capacitance can be equalized with respect to the semiconductor device that operates the dummy element portion 110 as a current sensor. Thus, even if concomitantly using the two types of semiconductor devices, the variations of the characteristics such as the switching speed can be suppressed.

Figure 3:
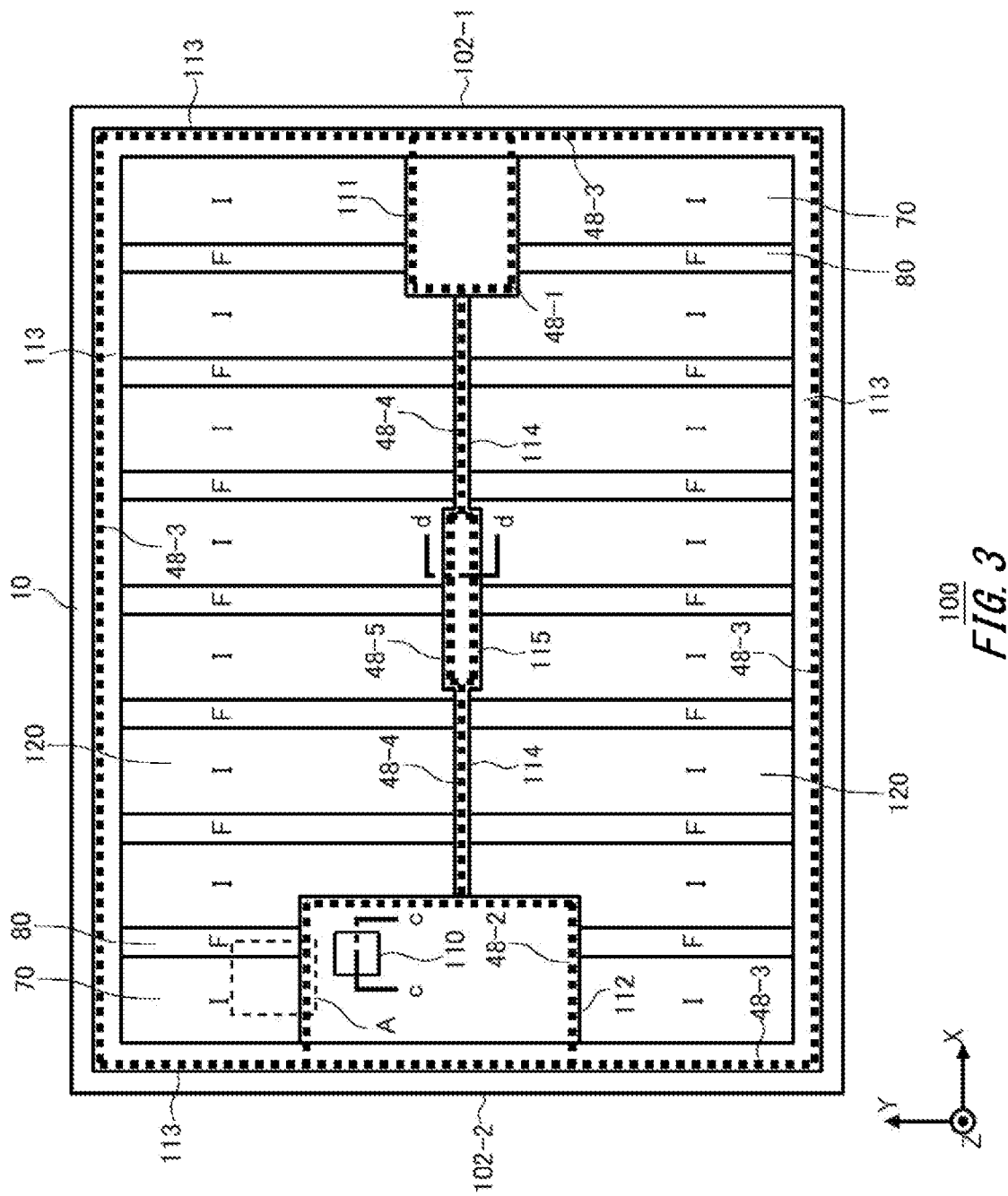
FIG. 3 illustrates an exemplary arrangement of a transistor portion 70, a diode portion 80 and a gate runner 48 on the upper surface of the semiconductor device 100.

FIG. 3 illustrates an exemplary arrangement of a transistor portion 70, a diode portion 80 and a gate runner 48 on the upper surface of the semiconductor device 100. In FIG. 3, the region where the transistor portion 70 is arranged is marked with symbol "I" and the region where the diode portion 80 is arranged is marked with symbol "F". The transistor portion 70 and the diode portion 80 may be arranged alternately in the X axis direction. When the active portion 120 is divided by the dividing well region 114, in each region of the active portion 120, the transistor portion 70 and the diode portion 80 may be alternately arranged in the X axis direction.

In FIG. 3, the gate runner 48 is illustrated by dashed lines. The gate runner 48 is the wiring formed of polysilicon with impurities added, or conductive materials such as metals. The gate runner 48 supplies the gate voltage that is applied to the gate pad 50, to each transistor portion 70. The gate runner 48 may be arranged above the well regions.

The semiconductor device 100 may have a gate runner 48-3 arranged enclosing the active portion 120 in a top view. The gate runner 48-3 may be arranged above the peripheral well region 113.

The semiconductor device 100 may have a gate runner 48-1 enclosing at least a part of the first well region 111 in a top view. The gate runner 48-1 may be arranged along the end side of the first well region 111 in a top view. The gate runner 48-1 may have a portion parallel to each end side of the first well region 111.

The semiconductor device 100 may have a gate runner 48-2 enclosing at least a part of the second well region 112 in a top view. The gate runner 48-2 may be arranged along the end side of the second well region 112 in a top view. The gate runner 48-2 may have a portion parallel to each end side of the second well region 112.

The semiconductor device 100 may have a gate runner 48-4 arranged above the dividing well region 114 in a top view. The semiconductor device 100 may have a gate runner 48-5 enclosing at least a part of the wide portion 115 in a top view. The gate runner 48-5 may be arranged along the end side of the wide portion 115 in a top view. The gate runner 48-5 may have a parallel portion to each end side of the wide portion 115. The gate runner 48-4 and the gate runner 48-5 may divide the active portion 120 in a top view.

The semiconductor device 100 may also include an edge termination structure portion between the peripheral well region 113 and the end side of the semiconductor substrate 10. The edge termination structure portion relaxes the electric field concentration of the upper surface side of the semiconductor substrate 10. The edge termination structure portion has, for example, guard rings, field plates, RESURFs and a structure including a combination thereof, provided annularly to enclose the active portion 120.

Figure 4:
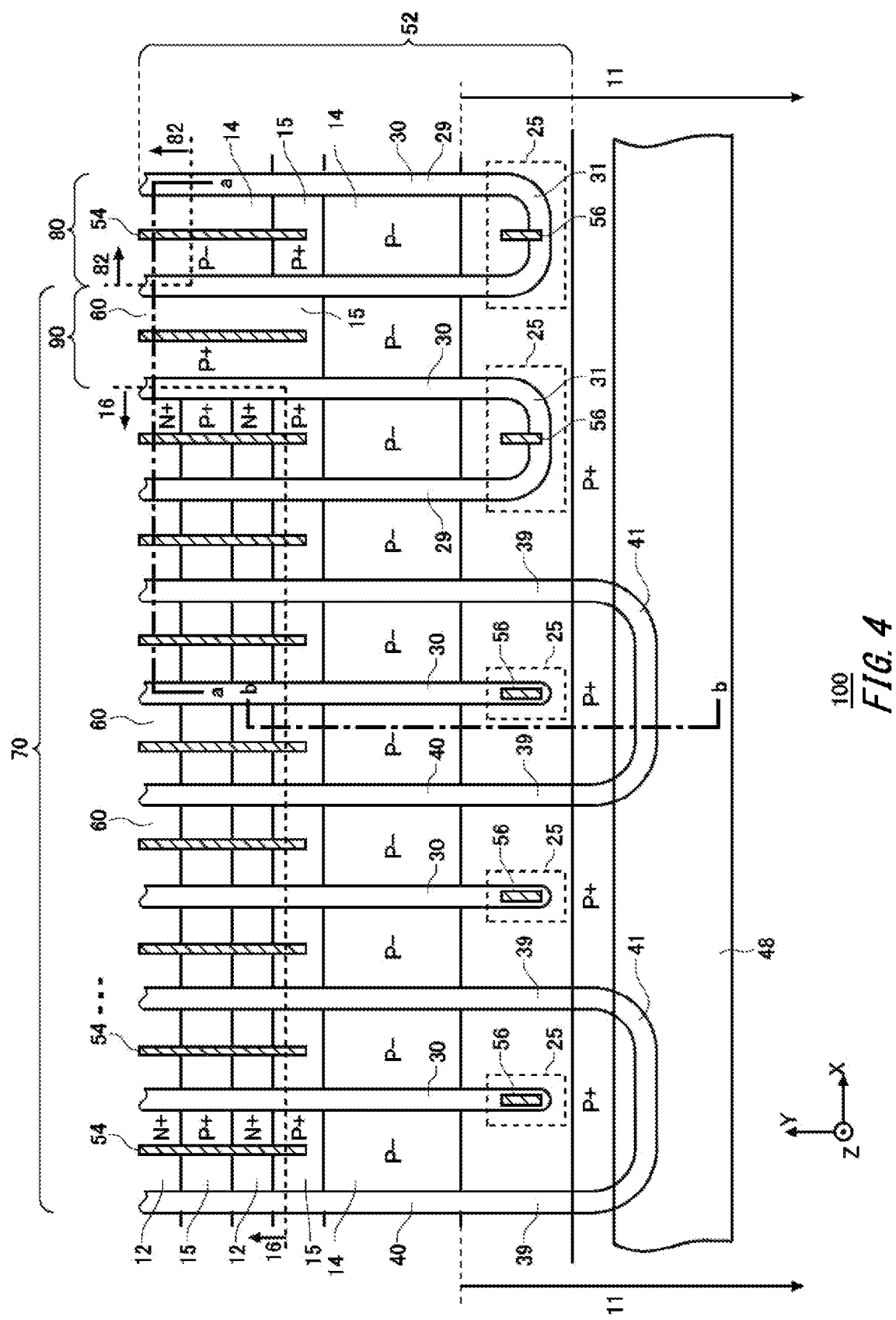
FIG. 4 illustrates an enlarged view of the region A in FIG. 3.

FIG. 4 illustrates an enlarged view of the region A in FIG. 3. The region A is a region including the gate runner 48, the transistor portion 70 and the diode portion 80. Although the gate runner 48 of this example corresponds to the gate runner 48-2 above the second well region 112, the arrangement with respect to the transistor portion 70 and the diode portion 80 is the same for other gate runners 48.

The semiconductor device 100 of this example includes gate trench portions 40, dummy trench portions 30, a well region 11, emitter regions 12, base regions 14 and contact regions 15 provided in the interior on the upper surface side of the semiconductor substrate 10. The well region 11 of this example corresponds to the second well region 112, but the first well region 111, the peripheral well region 113 and the dividing well region 114 have the same structure as the well region 11.

FIG. 4 illustrates the range where the emitter electrode 52 is provided. Although the emitter electrode 52 of this example is provided in a range that does not overlap the gate runner 48, it may also overlap the gate runner 48. In this case, an insulating film is provided between the emitter electrode 52 and gate runner 48. An interlayer dielectric film is provided between the emitter electrode 52 and the upper surface of the semiconductor substrate, but the illustration thereof is omitted in FIG. 4. Contact holes 56 and contact holes 54 are provided in the interlayer dielectric film in this example, penetrating the interlayer dielectric film.

The emitter electrode 52 is in contact with the emitter region 12, the contact region 15 and the base region 14 on the upper surface of the semiconductor substrate through the contact holes 54. Also, the emitter electrode 52 is connected with the dummy conductive portion within the dummy trench portion 30 through the contact holes 56. A connecting portion 25 formed of conductive materials such as polysilicon doped by impurities may be provided between the emitter electrode 52 and the dummy conductive portion. The connecting portion 25 is provided on the upper surface of the semiconductor substrate. An insulating film such as a thermal oxide film is provided between the connecting portion 25 and the semiconductor substrate.

An insulating film such as a thermal oxide film is provided between the gate runner 48 and the semiconductor substrate. The gate runner 48 is connected with the gate conductive portion within the gate trench portion 40 on the upper surface of the semiconductor substrate. The gate runner 48 is not connected with the dummy conductive portion within the dummy trench portion 30. The gate runner 48 of this example is provided to overlap the edge portion 41 of the gate trench portion 40. The edge portion 41 is the end closest to the gate runner 48 in the gate trench portion 40. The gate conductive portion is exposed on the upper surface of the semiconductor substrate in the edge portion 41 of the gate trench portion 40, and is in contact with the gate runner 48.

The emitter electrode 52 is formed of materials containing metals. For example, at least a part of the region of the emitter electrode 52 is formed of aluminum or aluminum-silicon alloy. The emitter electrode 52 may have barrier metals formed of titanium, titanium compounds or the like in the bottom layer of the region formed of aluminum and so on. Furthermore, there may also be a plug formed of embedding tungsten or the like in the contact holes so as to be in contact with the barrier metal and aluminum or the like.

One or more gate trench portions 40 and one or more dummy trench portions 30 are arrayed at predetermined intervals along a predetermined array direction in the region of the transistor portion 70. The array direction in FIG. 4 is the X axis direction. In the transistor portion 70, one or more gate trench portions 40 and one or more dummy trench portions 30 may be provided alternately along the array direction.

The gate trench portion 40 of this example may have two extending portions 39 (the portions of the trench that are straight along the extending direction) that extend along the extending direction perpendicular to the array direction, and an edge portion 41 that connects the two extending portions 39. The extending direction in FIG. 4 is the Y axis direction. At least a part of the edge portion 41 is preferably provided in a curved manner. In the two extending portions 39 of the gate trench portion 40, the electric field concentration at the ends of the extending portions 39 can be relaxed by connecting the ends of linear shapes along the extending direction to each other by the edge portions 41.

The dummy trench portions 30 of this example are provided between each of the extending portions 39 of the gate trench portions 40. These dummy trench portions 30 may have a linear shape that extends in the extending direction.

In the transistor portion 70, the boundary in direct contact with the diode portion 80 may include an intermediate region 90 with no emitter region provided on the surface. Also, in the transistor portion 70, a plurality of dummy trench portions 30 may be consecutively arrayed in a portion in direct contact with the intermediate region 90. The dummy trench portions 30 provided in the portion in direct contact with the intermediate region 90 may have extending portions 29 and edge portions 31. The edge portion 31 and the extending portion 29 have the same shape as the edge portion 41 and the extending portion 39. The length in the extending direction of the dummy trench portions 30 with the edge portions 31 and the linearly shaped dummy trench portions 30 may be the same.

The emitter electrode 52 is provided above the gate trench portion 40, the dummy trench portions 30, the well region 11, the emitter region 12, the base region 14 and the contact region 15. The well region 11 is provided in a predetermined range away from the contact holes 54. The diffusion depth of the well region 11 may be deeper than the depth of the gate trench portion 40 and the dummy trench portions 30. A well region 11 may be provided on the end of the extending direction of the gate trench portion 40 and the dummy trench portions 30.

A base region 14 is provided in the mesa portion 60 sandwiched by each trench portion. The mesa portion is the region on the upper surface side above the deepest bottom portion of the trench portion, among the portions of semiconductor substrate sandwiched by the trench portions. The base region 14 is a second conductivity type with a lower doping concentration than the well region 11. The base region 14 of this example is of P− type, and the well region 11 is of P+ type.

On the upper surface of the base region 14 of the mesa portion 60, a second conductivity type contact region 15 with a higher doping concentration than the base region 14 is provided. The contact region 15 of this example is of P+ type. The well region 11 may be provided away from the contact region 15 that is arranged at the farthest end of the contact region 15 in the extending direction of the trench portion, in the direction of the gate runner 48. Also, in the transistor portion 70, a first conductivity type emitter region 12 with a higher doping concentration than the semiconductor substrate 10 is selectively provided on a portion of the upper surface of the contact region 15. The emitter region 12 of this example is of N+ type.

Each of the contact region 15 and the emitter region 12 is provided from one adjacent trench portion to the other trench portion. One or more contact regions 15 and one or more emitter regions 12 of the transistor portion 70 are provided to be exposed alternately on the upper surface of the mesa portion 60 along the extending direction of the trench portions.

In other examples, the contact regions 15 and the emitter regions 12 may also be provided in the mesa portion 60 in the transistor portion 70 in a striped pattern along the extending direction. For example, the emitter regions 12 are provided in the regions in direct contact with the trench portions, and the contact regions 15 are provided in the regions sandwiched by the emitter regions 12.

The emitter regions 12 may not be provided in the mesa portion 60 of the diode portion 80. Also, the contact regions 15 are provided in the mesa portion 60 of the intermediate region 90 over a larger area than the mesa portion 60 of the transistor portion 70.

In the transistor portion 70, the contact holes 54 are provided above each region of the contact regions 15 and the emitter regions 12. The contact holes 54 are not provided in the region corresponding to the base region 14 and the well region 11. In the diode portion 80, contact holes 54 are provided above the contact region 15 and the base region 14.

In the diode portion 80, an N+ type cathode region 82 is provided in a region in direct contact with the lower surface of the semiconductor substrate. In FIG. 4, the region where the cathode region 82 is provided is illustrated by dotted lines. AP+ type collector region may be provided in the region where the cathode region 82 is not provided, in the region in direct contact with the lower surface of the semiconductor substrate. FIG. 4 illustrates one mesa portion 60 of the diode portion 80, but there may be a plurality of mesa portions 60 in the diode portion 80 in the X axis direction.

An N+ type accumulation region 16 is provided in the at least a part of the region of the transistor portion 70. In FIG. 4, the region where the accumulation region 16 is provided is illustrated by dotted lines. The accumulation region 16 may be provided under the emitter region 12 or the contact region 15 in each mesa portion 60.

Figure 5:
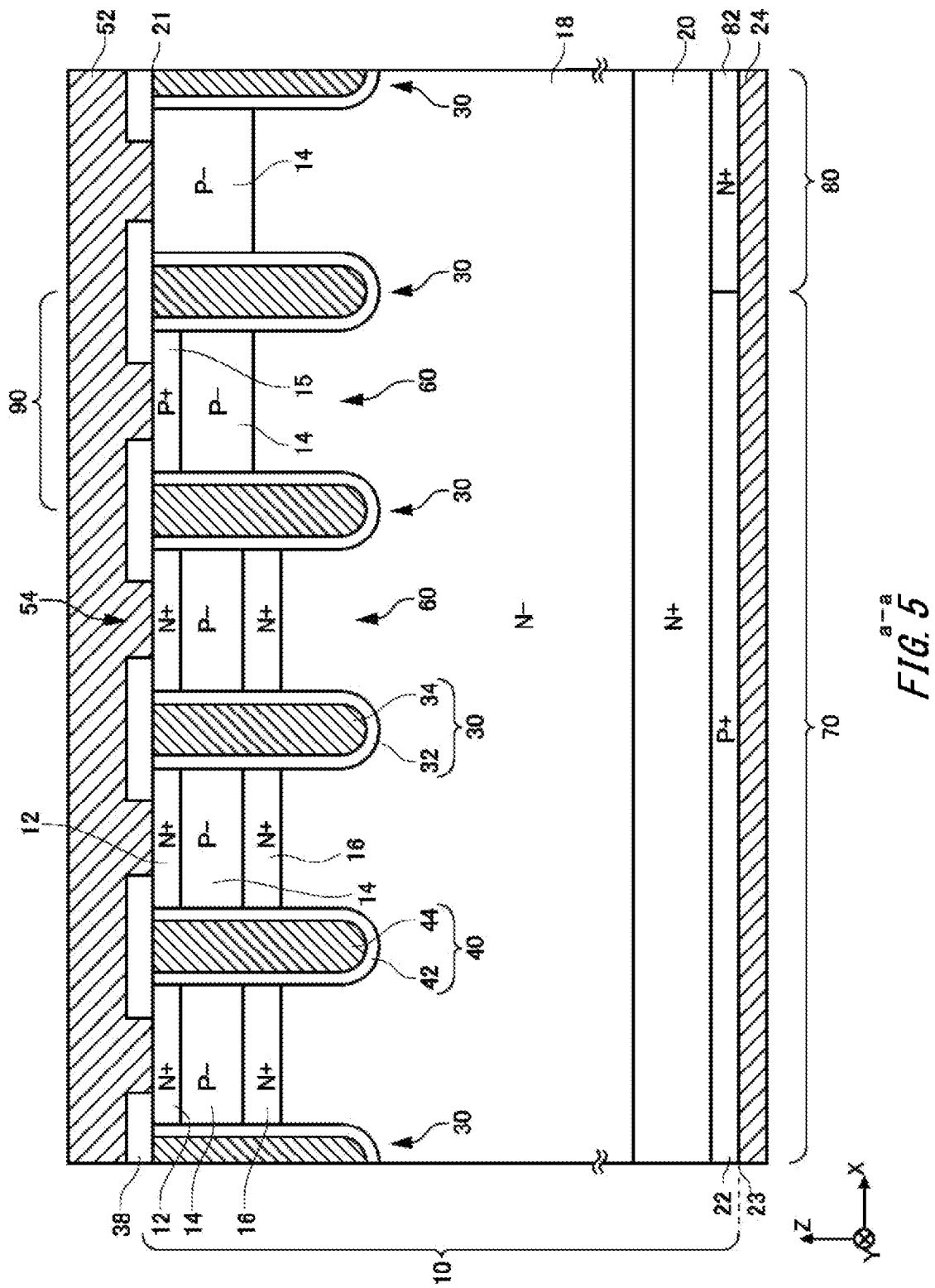
FIG. 5 illustrates one example of a cross section taken along a-a in FIG. 4.

FIG. 5 illustrates one example of a cross section taken along a-a in FIG. 4. The cross section taken along a-a is the XZ plane passing through the emitter regions 12. The semiconductor device 100 of this example has a semiconductor substrate 10, an interlayer dielectric film 38, an emitter electrode 52 and a collector electrode 24 in the cross section. The emitter electrode 52 is provided on the upper surface of the semiconductor substrate 10 and the interlayer dielectric film 38.

The collector electrode 24 is provided on the lower surface 23 of the semiconductor substrate 10. The emitter electrode 52 and the collector electrode 24 are provided by conductive materials such as metals. In this specification, the depth direction is referred to as the direction connecting the emitter electrode 52 and the collector electrode 24.

The semiconductor substrate 10 may be a silicon substrate, may be a silicon carbide substrate, and may also be a nitride semiconductor substrate such as gallium nitride and so on. The semiconductor substrate 10 of this example is a silicon substrate. On the upper surface 21 of the semiconductor substrate 10 in the cross section, a P– type base region 14 is provided.

In the cross section, on the upper surface 21 of the semiconductor substrate 10 of the transistor portion 70, an N+ type emitter region 12, a P– type base region 14, and an N+ type accumulation region 16 are provided in order from the upper surface 21 of the semiconductor substrate 10.

In the cross section, on the upper surface 21 of the semiconductor substrate 10 of the diode portion 80, a P– type base region 14 is provided. The accumulation region 16 is not provided in the diode portion 80 of this example. In other examples, the accumulation region 16 may also be provided in the diode portion 80. Also, on the upper surface 21 of the semiconductor substrate 10 of the mesa portion 60 in direct contact with the transistor portion 70, the contact regions 15 is provided.

A N– type drift region 18 is provided under the accumulation region 16 in the transistor portion 70. By providing the accumulation region 16 with a higher concentration than the drift region 18 between the drift region 18 and the base region 14, the carrier implantation enhancement effect (IE effect) can be enhanced and the on-voltage can be reduced.

The accumulation region 16 of this example is provided in each mesa portion 60 of the transistor portion 70. The accumulation region 16 may be provided to cover the entire lower surface of the base region 14 of each mesa portion 60. In the diode portion 80, a drift region 18 is provided on the lower surface of the base region 14. In both of the transistor portion 70 and the diode portion 80, an N+ type buffer region 20 is provided under the drift region 18.

The buffer region 20 is provided under the drift region 18. The doping concentration of the buffer region 20 is higher than the doping concentration of the drift region 18. The buffer region 20 may function as a field stop layer that prevents the depletion layer extending from the lower surface of the base region 14 from reaching the P+ type collector region 22 and the N+ type cathode region 82.

In the transistor portion 70, a P+ type collector region 22 is provided under the buffer region 20. In the diode portion 80, an N+ type cathode region 82 is provided under the buffer region 20. Additionally, in the active portion 120, the projected region that overlaps the cathode region 82 in the Z axis direction is taken as the diode portion 80. That is, a projected region when the cathode region 82 is projected against the upper surface 21 of the semiconductor substrate 10 in a direction perpendicular to the lower surface 23 of the semiconductor substrate 10 is defined as the diode portion 80. Also, a projected region extending to the well region in the Y-axis direction may also be taken as the diode portion 80. Also, in the active portion 120, the transistor portion 70 is the projected region when the collector region 22 is projected against the upper surface 21 of the semiconductor substrate 10 in a direction perpendicular to the lower surface 23 of the semiconductor substrate 10, and the region in which the predetermined unit configurations, including the emitter regions 12 and the contact regions 15, are regularly arranged.

On the upper surface 21 of the semiconductor substrate 10, one or more gate trench portions 40 and one or more dummy trench portions 30 are provided. Each trench portion is provided to reach the drift region 18 by penetrating the base region 14 from the upper surface 21 of the semiconductor substrate 10. In the region where at least any one of the emitter region 12, the contact region 15 and the accumulation region 16 is provided, each trench portion reaches the drift region 18 by penetrating these regions. The trench portion penetrating the doping region is not limited to those manufactured in the order, in which the doping region is formed and then the trench portion is formed. After the formation of the trench portions, a doping region formed between the trench portions is also included in the one, in which the trench portions penetrate the doping region.

The gate trench portion 40 has a gate insulating film 42 and a gate conductive portion 44 provided on the upper surface 21 of the semiconductor substrate 10. The gate insulating film 42 is provided to cover the inner wall of the gate trench portion 40. The gate insulating film 42 may be formed of oxidizing or nitrifying the semiconductor on the inner wall of the gate trench portion 40. The gate conductive portion 44 is provided inside the gate insulating film 42 in the interior of the gate trench portion 40. That is, the gate insulating film 42 insulates the gate conductive portion 44 from the semiconductor substrate 10. The gate conductive portion 44 is formed of conductive materials such as polysilicon.

The gate conductive portion 44 includes a region opposite the base region 14 sandwiching the gate insulating film 42. The gate trench portion 40 in the cross section is covered by the interlayer dielectric film 38 on the upper surface 21 of the semiconductor substrate 10. When a predetermined voltage is applied to the gate conductive portion 44, a channel with an inverted layer of electrons is formed on the surface layer of the interface in contact with the gate trench of the base region 14.

In the cross section, the dummy trench portions 30 may have the same structure as the gate trench portion 40. The dummy trench portions 30 has a dummy trench, a dummy insulating film 32 and a dummy conductive portion 34 provided on the upper surface 21 of the semiconductor substrate 10. The dummy insulating film 32 is provided to cover the inner wall of the dummy trench. The dummy conductive portion 34 is provided inside the dummy insulating film 32, and in the interior of the dummy trench. The dummy insulating film 32 insulates the dummy conductive portion 34 from the semiconductor substrate 10. The dummy conductive portion 34 may be formed of the same materials as the gate conductive portion 44.

Figure 6:
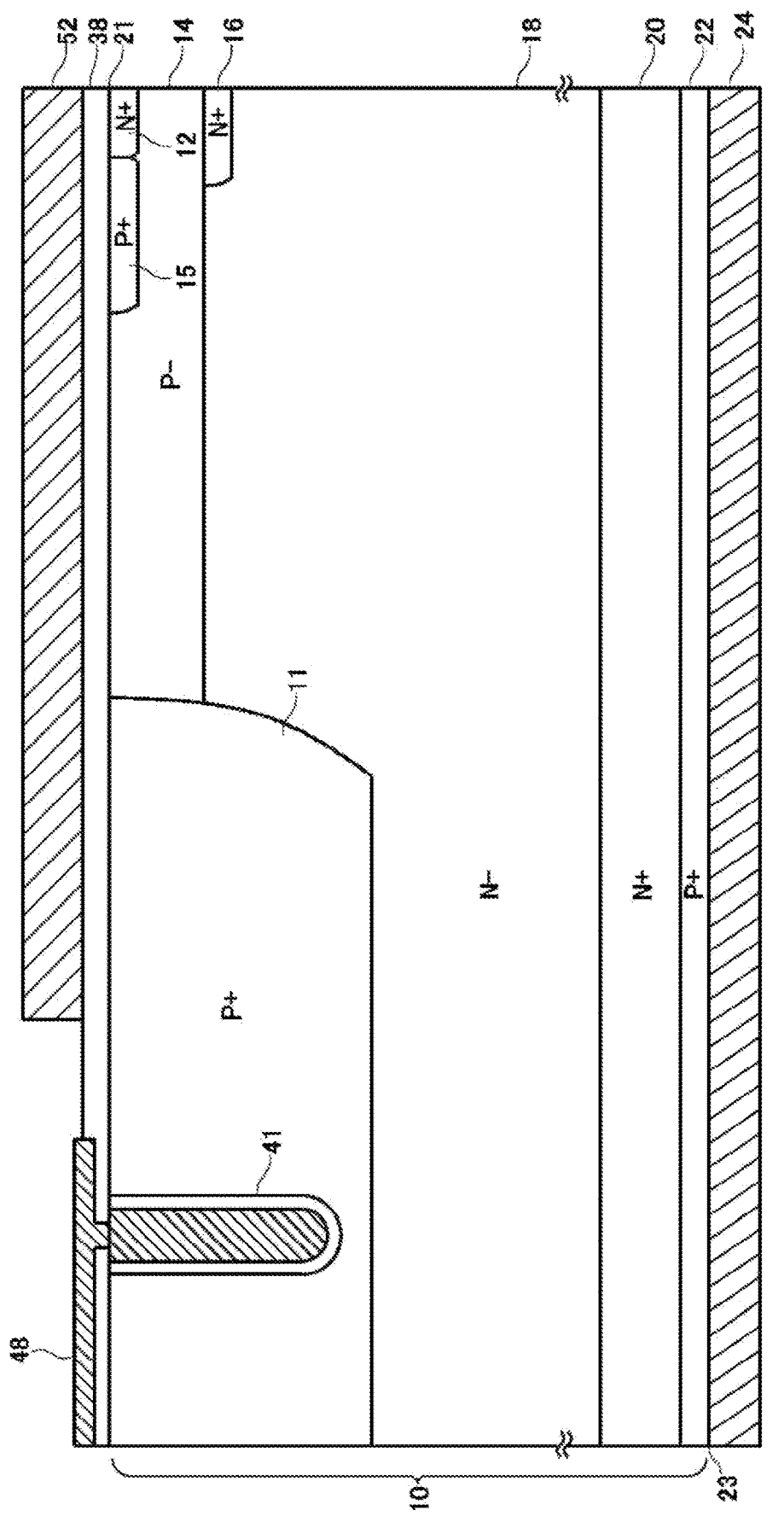
FIG. 6 illustrates one example of a cross section taken along b-b in FIG. 4.

FIG. 6 illustrates one example of a cross section taken along b-b in FIG. 4. The cross section taken along b-b is the YZ plane passing through the edge portion 41 of the gate trench portion 40. The edge portion 41 is enclosed by the well region 11. The well region 11 is a P type region exposed on the upper surface 21 of the semiconductor substrate 10, with a higher doping concentration than the base region 14, and, is a region provided to a deeper position than the base region 14. The doping concentration of the well region 11 may be more than 10 times higher than the doping concentration of the base region 14. The well region 11 may be provided to a deeper position than accumulation region 16, or may also be provided to a deeper position than the lower end of the edge portion 41, by taking the upper surface 21 as a reference. Each well region illustrated in FIG. 1 may have the same doping concentration and depth as the well region 11.

Figure 7:
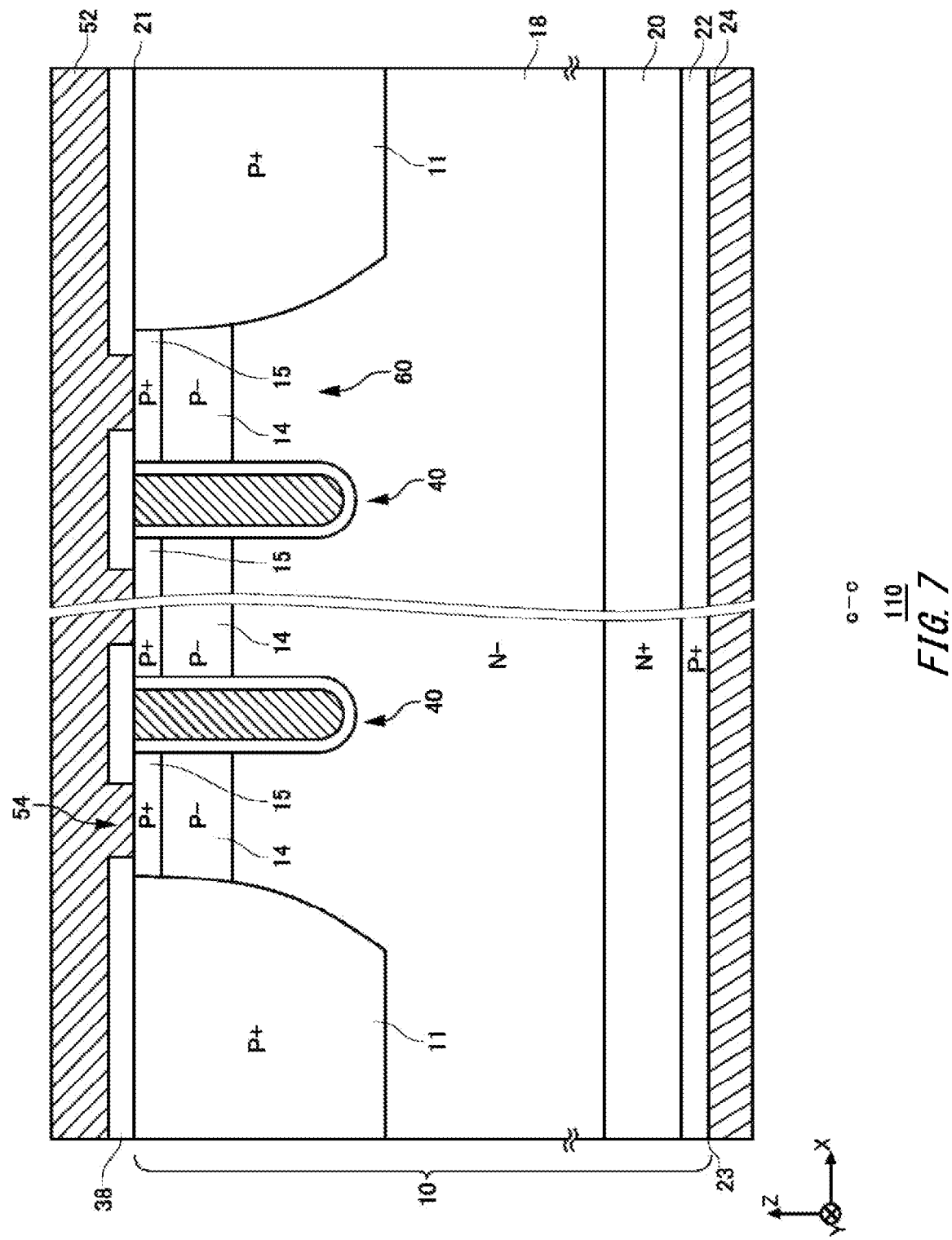
FIG. 7 illustrates one example of a XZ cross section of a dummy element portion 110.

FIG. 7 illustrates one example of a XZ cross section of the dummy element portion 110. The dummy element portion 110 is enclosed by the well region 11 (the second well region 112 in FIG. 1). The dummy element portion 110 of this example has one or more gate trench portions 40, and one or more mesa portions 60.

The structure of the gate trench portion 40 of the dummy element portion 110 may be the same as the structure of the gate trench portion 40 of the transistor portion 70. The gate trench portion 40 of the dummy element portion 110 is connected with the gate runner 48. Thereby, the variation of the gate capacitance can be suppressed. The density per unit area of the gate trench portion 40 of the dummy element portion 110, may be higher than the density per unit area of the gate trench portion 40 of the transistor portion 70. The dummy element portion 110 may be provided with a plurality of gate trench portions 40 but not with a dummy trench portion 30.

The mesa portion 60 of the dummy element portion 110 may have a structure that is different from the mesa portion 60 of the transistor portion 70. The emitter regions 12 may not be provided in the mesa portion 60 of the dummy element portion 110. In this way, operation of the dummy element portion 110 as a transistor can be prevented. The base region 14 and the contact regions 15 are provided in the mesa portion 60 of this example.

The mesa portion 60 of the dummy element portion 110 may be connected with the emitter electrode 52 by the contact holes 54. This enables the base region 14 and the contact regions 15 of the dummy element portion 110 to be electrically connected to the emitter electrode 52, and to be fixed to an emitter potential. Thereby, the dummy element portion 110 turning into unanticipated states can be suppressed. Also, the holes accumulated in the drift region 18 of the dummy element portion 110 can be extracted to the emitter electrode 52. Thereby, excessive hole accumulation in the dummy element portion 110 can be suppressed.

The accumulation region 16 may not be provided in the mesa portion 60 of the dummy element portion 110. This enables the facilitation of the extraction of the holes in the dummy element portion 110.

Figure 8:
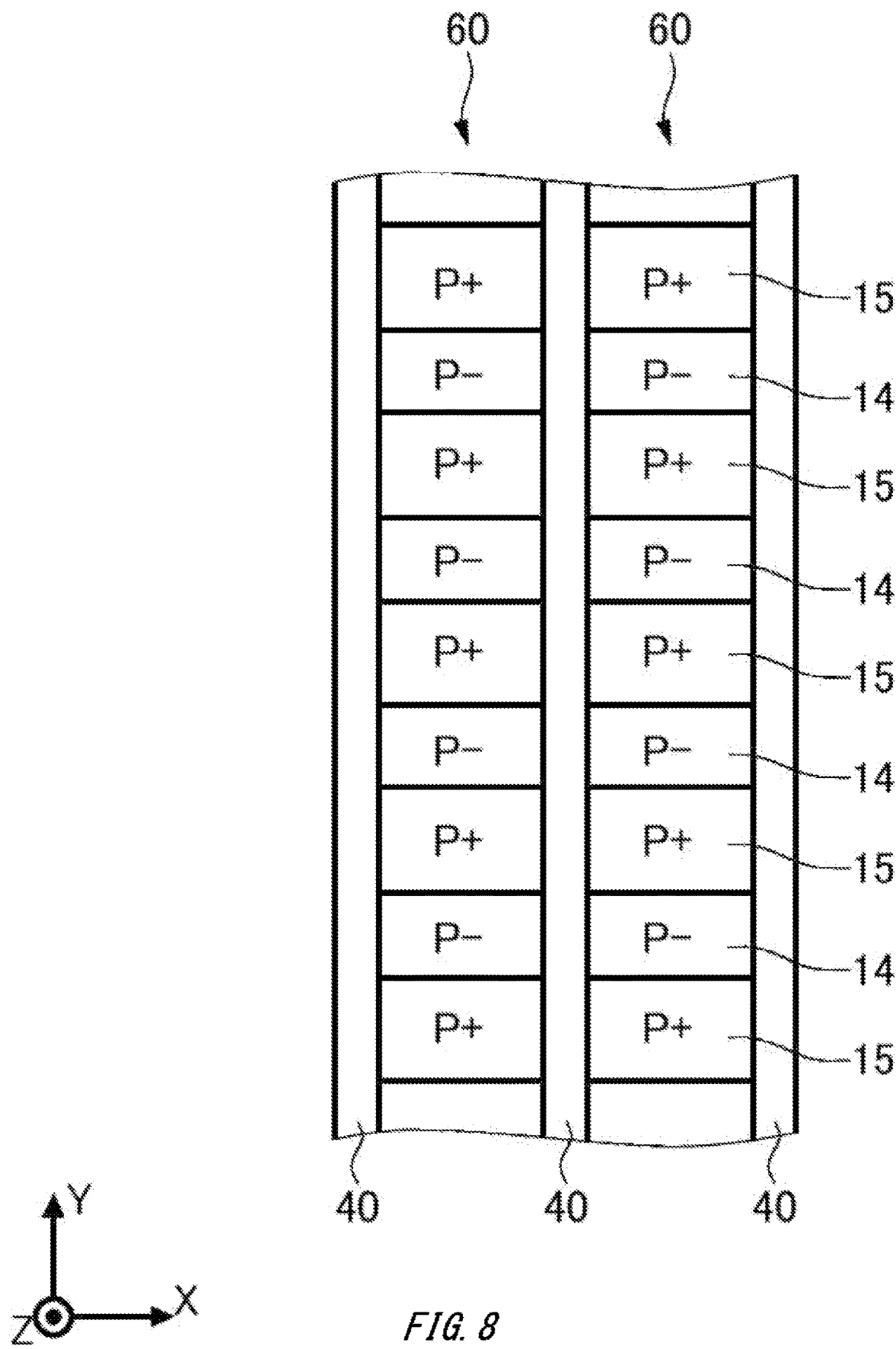
FIG. 8 illustrates one example of the upper surface of a mesa portion 60 of the dummy element portion 110.

FIG. 8 illustrates one example of the upper surface of the mesa portion 60 of the dummy element portion 110. In this example, a P type region is provided in the region in contact with the gate trench portion 40 on the upper surface of the dummy element portion 110. That is, the emitter regions 12 is not provided in in the region in contact with the gate trench portion 40. In the example of FIG. 8, the contact regions 15 and the base regions 14 are alternately arranged along the trench longitudinal direction of the gate trench portion 40 on the upper surface of the mesa portion 60 of the dummy element portion 110. Additionally, the configuration is not limited to this example, and any of the contact regions 15 or the base regions 14 may also be arranged along the trench longitudinal direction of the gate trench portion 40 on the upper surface of the mesa portion 60 of the dummy element portion 110. The gate trench portion 40 has a longitudinal length in the trench longitudinal direction. The trench longitudinal direction of this example is the Y axis direction.

As described above, in other semiconductor devices, the dummy element portion 110 is a region in which the current sensor is formed. In a top view, the area of the dummy element portion 110 is equal to or smaller than the area of the active portion 120. The area of the dummy element portion 110 may be equal to or smaller than $1/100$ of the area of the active portion 120, may be equal to or smaller than the $1/1000$, or may be equal to or smaller than the $1/10000$. The area of the dummy element portion 110 may be the area of the region enclosed by the second well region 112 in a top view. The area of the active portion 120 may be the area of the region where a well region is not provided, among the region enclosed by the peripheral well region 113.

Figure 9:
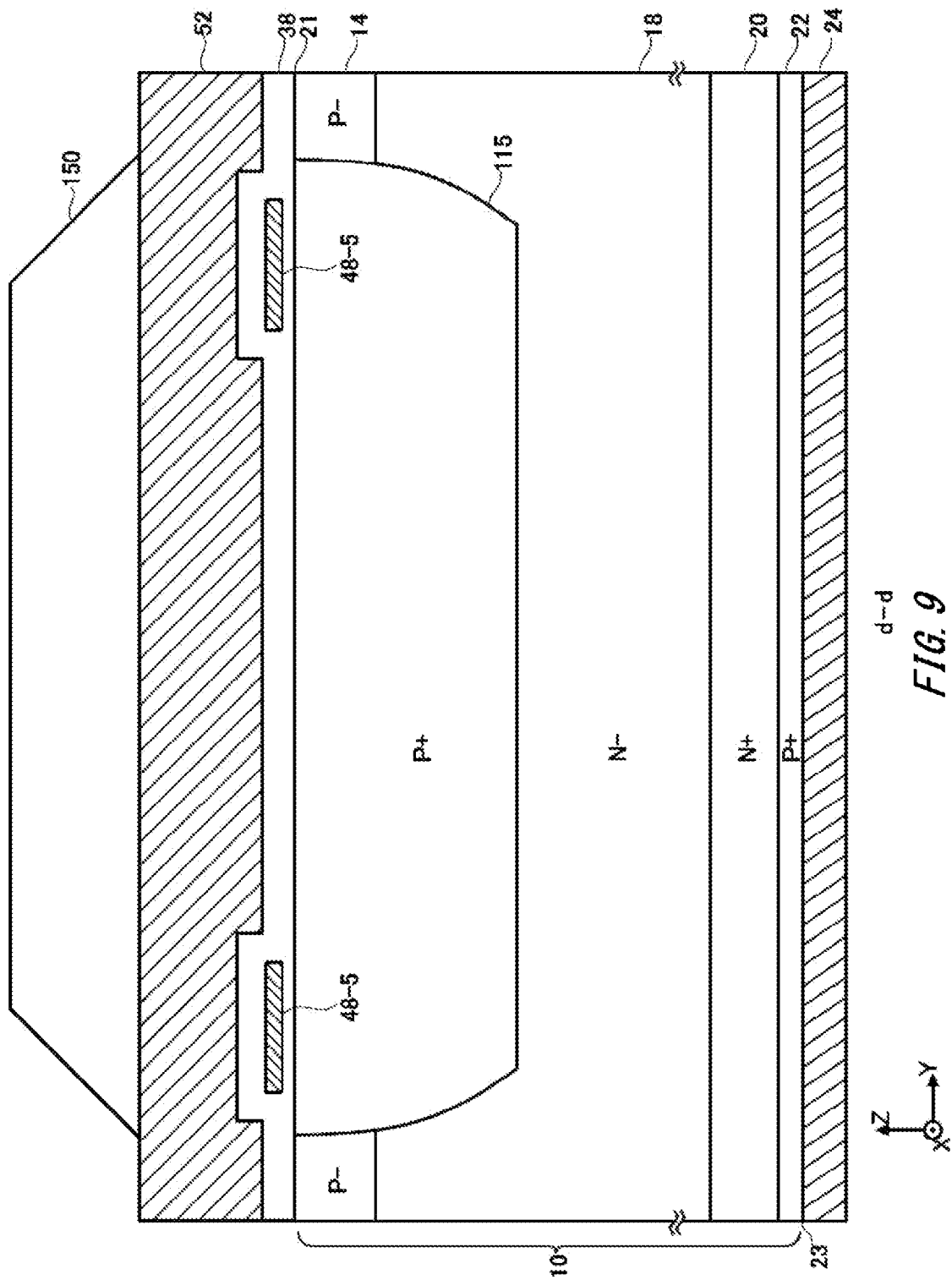
FIG. 9 illustrates one example of a cross-section taken along d-d in FIG. 3.

FIG. 9 illustrates one example of a cross-section taken along d-d in FIG. 3. The cross-section taken along d-d is the YZ plane passing through the wide portion 115 of the dividing well region 114. Two gate runners 48-5 are arranged above the wide portion 115. Two gate runners 48-5 are arranged away from each other in the Y axis direction.

When the wide portion 115 is halved in the Y axis direction, one gate runner 48-5 is arranged in one divided region, and one gate runner 48-5 is arranged in the other divided region. An interlayer dielectric film 38 such as a thermally oxidized film is provided between the gate runners 48-5 and the semiconductor substrate 10.

The emitter electrode 52 is arranged above the gate runner 48-5. An interlayer dielectric film 38 such as BPSG film is provided between the emitter electrode 52, and the gate runner 48-5 and the semiconductor substrate 10. The emitter electrode 52 of this example wholly covers the wide portion 115. A protective layer 150 formed of polyimide and so on may be provided above the emitter electrode 52. The protective layer 150 covers the wide portion 115 partially or wholly.

A configuration including a temperature sensor above the semiconductor substrate 10 is known as a semiconductor device. For example, the temperature sensor is arranged above the region corresponding to the wide portion 115 of this example. The temperature sensor is, for example, a PN junction diode formed of polysilicon.

A temperature sensor is not provided above the wide portion 115 of the semiconductor device 100 in this example. Thereby, although the detection of the temperature of the semiconductor device 100 becomes difficult, the assembling of the semiconductor device 100 becomes easier. Accordingly, the manufacturing cost can be reduced.

As described above, the emitter electrode 52 is arranged above the wide portion 115 in this example. This enables the arrangement of the shared emitter electrode 52 to be easier for the plurality of active portions 120, divided by the dividing well region 114. Thus, even if the emitter electrode 52 is not connected by wires between the plurality of the active portions 120, the variations of the emitter potential can be suppressed on the upper surface of the semiconductor substrate 10.

Also, a configuration including wirings connected to the temperature sensor above the dividing well region 114 is known. The wirings are formed of conductive materials such as metals. Wirings or electrodes other than the emitter electrode 52 are not arranged above the dividing well region 114 in the semiconductor device 100 of this example. This enables the assembling of the semiconductor device 100 to become easier. Accordingly, the manufacturing cost can be reduced. As illustrated in FIG. 2, the emitter electrode 52 is arranged above the dividing well region 114 in this example.

Figure 10:
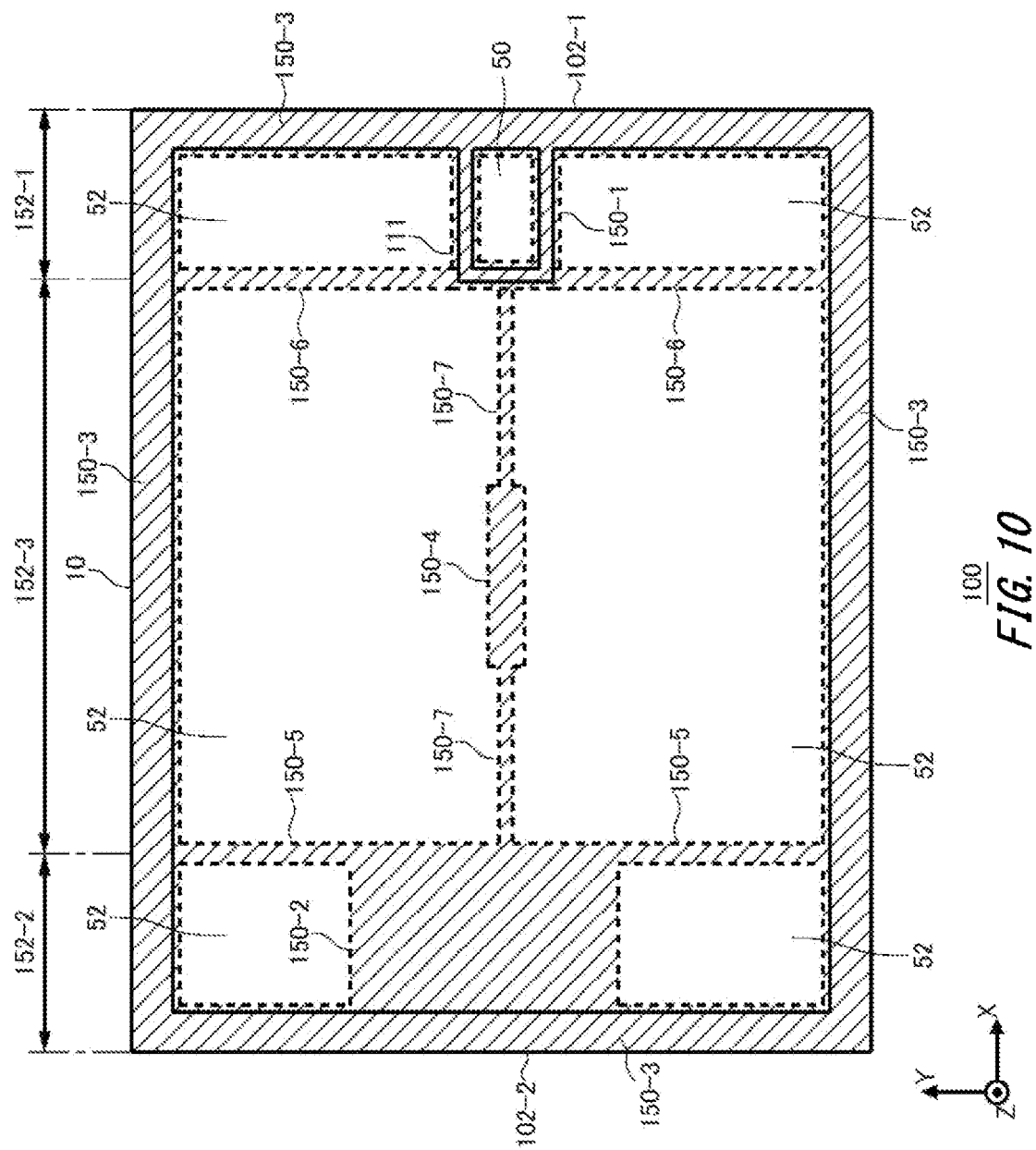
FIG. 10 illustrates a top view of an exemplary arrangement of a protective layer 150.

FIG. 10 illustrates a top view of an exemplary arrangement of the protective layer 150. In FIG. 10, the region where the protective layer 150 is arranged is illustrated by the hatching of diagonal lines. The protective layer 150 may be provided above the emitter electrode 52 and the semiconductor substrate 10. The protective layer 150 may be in contact with the upper surface of the emitter electrode 52.

The semiconductor device 100 may have a protective layer 150-1 covering the first well region 111. The protective layer 150-1 may expose a part of the upper surface of the pad 50. Thereby, the upper surface of the pad 50 can be connected by wires.

The semiconductor device 100 may have a protective layer 150-2 covering the second well region 112. The protective layer 150-2 may wholly cover the second well region 112. The semiconductor device 100 may have a protective layer 150-3 covering the peripheral well region 113. The protective layer 150-3 may wholly cover the peripheral well region 113. The semiconductor device 100 may have a protective layer 150-4 and a protective layer 150-7 covering the dividing well region 114. The protective layer 150-4 and the protective layer 150-7 may wholly cover the dividing well region 114. In this example, the protective layer 150-4 covers the whole of the wide portion 115, and the protective layer 150-7 covers the whole of the dividing well region 114 other than the wide portion 115.

The protective layer 150 exposes a part of the upper surface of the emitter electrode 52. This enables the connection of wires to the upper surface of the emitter electrode 52 to be easier.

The semiconductor device 100 may have a protective layer 150-5 and a protective layer 150-6 dividing the upper surface of the semiconductor substrate 10 into a first region 152-1, a second region 152-2 and a third region 152-3. The protective layer 150-5 and the protective layer 150-6 may be provided traversing the upper surface of the semiconductor substrate 10 in the Y axis direction. The first region 152-1 is the region where the first well region 111 is provided, and the second region 152-2 is the region where the second well region 112 is provided, and the third region 152-3 is the region arranged between the first well region 111 and the second well region 112 in the X axis direction. In this embodiment, the third region 152-3 is halved in two by the protective layer 150-7 and the protective layer 150-4 in the Y axis direction.

The protective layer 150-4 is provided in the third region 152-3 of this example The area of the third region 152-3 of this example is larger than the area of any of the first region 152-1 and the second region 152-2. The protective layer 150-5 may be connected with the protective layer 150-2. The protective layer 150-5 of this example is connected with the edge in the X axis direction of the protective layer 150-2. The protective layer 150-6 may be connected with the protective layer 150-1. The protective layer 150-6 of this example is connected with the edge in the X axis direction of the protective layer 150-1.

Solder or other connection material may be provided on the upper surface of the emitter electrode 52 exposed in the third region 152-3. Thereby, wirings such as wires or lead frames can be connected to the upper surface of the emitter electrode 52. By enlarging the area of the third region 152-3, these wirings can be easily connected.

Also, by separating the third region 152-3 and the first region 152-1 by the protective layer 150-6, the solder or the like of the third region 152-3 can be suppressed to flow to the pad 50. Also, by providing the second region 152-2 on the opposite side of the first region 152-1, a bias in the position of the solder or the like on the upper surface of the semiconductor substrate 10 can be suppressed.

Figure 11:
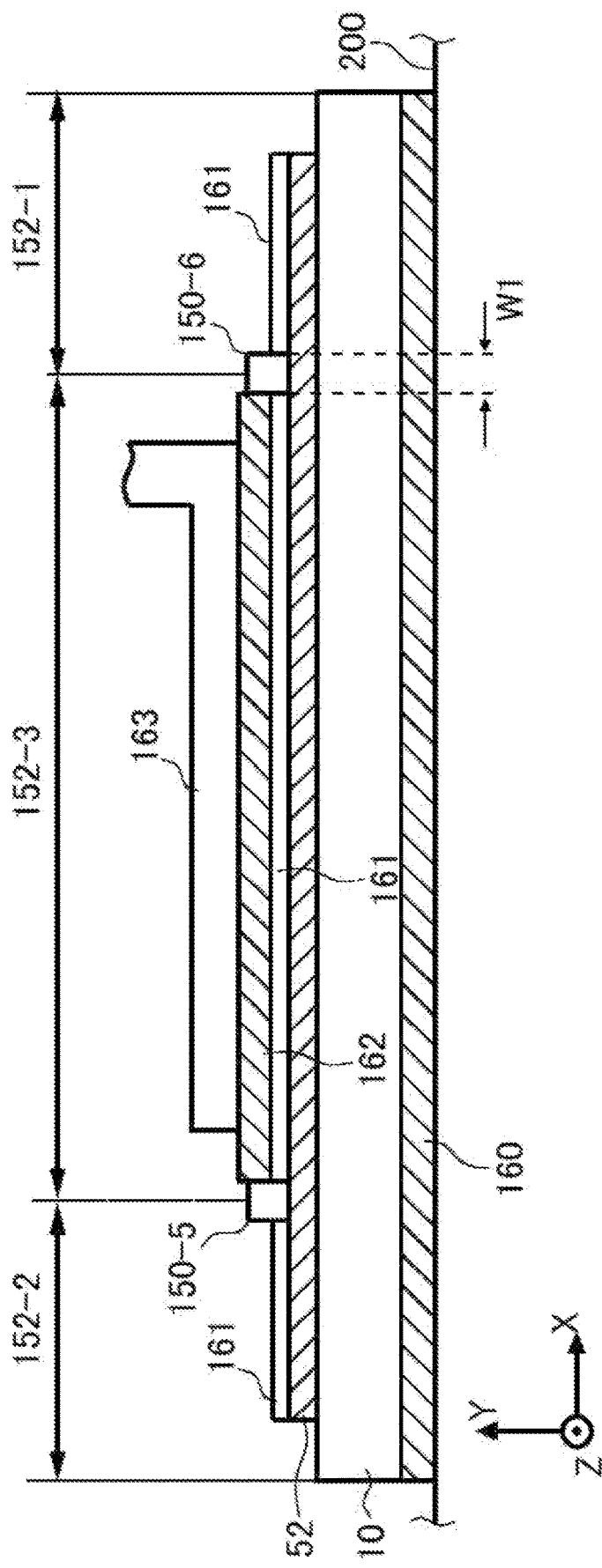
FIG. 11 illustrates a side view of the semiconductor substrate 10 in an implemented state in a packaging substrate 200.

FIG. 11 illustrates a side view of the semiconductor substrate 10 in the state of being implemented onto the packaging substrate 200. In FIG. 11, the collector electrode 24 and the interlayer dielectric film 38 and so on are omitted. The semiconductor substrate 10 is fixed on the packaging substrate 200 by the connecting portion 160 such as a solder. Also, the connecting portion 162 such as a solder is provided on the upper surface of the third region 152-3 of the emitter electrode 52. A plated portion 161 may also be provided between the connecting portion 162 and the emitter electrode 52.

The plated portion 161 may be a metallic plated layer that is different from the emitter electrode 52. The plated portion 161 may also be provided on the upper surface of the emitter electrode 52 where the connecting portion 162 is not arranged. The connecting portion 162 is connected to the emitter electrode 52 by the wiring 163 such as lead frames. The wiring 163 may also be provided across the two third regions 152-3 illustrated in FIG. 10. The wiring 163 may be provided above the protective layer 150-7 and the protective layer 150-4. In this case, a connecting portion 162 may be provided between the protective layer 150-7 and the protective layer 150-4, and the wiring 163. The top end of the connecting portion 162 provided in the third region 152-3 may be arranged above the top end of the protective layer 150.

As illustrated in FIG. 11, the flowing of the connecting portion 162 to the first region 152-1 and the second region 152-2 by the protective layer 150-6 and the protective layer 150-5 can be suppressed. Thereby, the bias in the position of the connecting portion 162 in the X axis direction can be suppressed. If the position of the connecting portion 162 is biased, the center of gravity of the semiconductor device 100 will be shifted from the center of gravity in the X axis direction. Thus, the semiconductor substrate 10 may be tilted in the Y axis direction in the step of implementing the semiconductor substrate 10 onto the packaging substrate 200 by the connecting portion 160. By providing the first region 152-1 and the second region 152-2, the bias in the position of the connecting portion 162, and the inclination of the semiconductor substrate 10 can be suppressed.

The widths of the first region 152-1 and the second region 152-2 in the X axis direction are preferably the same. The difference in the widths between the first region 152-1 and the second region 152-2 in the X axis direction may be equal to or less than 5% of the length of the semiconductor substrate 10 in the X axis direction. The width W1 of the protective layer 150-6 and the protective layer 150-5 may be 100 μm or more, may be 200 μm or more, or may also be 300 μm or more. The protective layer 150-7 may also have the width W1. The width of the protective layer 150 is the width of the protective layer 150 in the lateral direction in a top view.

The protective layer 150 described in FIG. 10 and FIG. 11 may also function as a beam portion for preventing the semiconductor device 100 from warping. The beam portion, as illustrated in the top view of FIG. 10, is the protective layer 150 sandwiched between the emitter electrode 52 that is not covered by the protective layer 150 in the lateral direction orthogonal to the longitudinal direction of the beam portion. The beam portion may be connected with the protective layer 150 in both ends of the longitudinal direction.

In FIG. 10, the protective layer 150-5 and the protective layer 150-6 function as the first beam portion, in which the first direction (the Y axis direction in this example) is the longitudinal direction. The protective layer 150-5 is sandwiched between the emitter electrode 52 exposed in the second region 152-2, and the emitter electrode 52 exposed in the third region 152-3, in the lateral direction (the X axis direction in this example). The protective layer 150-6 is sandwiched between the emitter electrode 52 exposed in the first region 152-1, and the emitter electrode 52 exposed in the third region 152-3, in the lateral direction (the X axis direction in this example).

In FIG. 10, the protective layer 150-4 and the protective layer 150-7 function as the second beam portion, in which the second direction (the X axis direction in this example) is the longitudinal direction. The second direction is a different direction from the first direction. Although in the example of FIG. 10, the first direction and the second direction are orthogonal, the angle formed of the first direction and the second direction is not limited to a right angle. The protective layer 150-4 and the protective layer 150-7 are sandwiched between the emitter electrode 52 exposed in two third regions 152-3 in the lateral direction (the Y-axis direction in this example).

At least one of the first beam portion and the second beam portion may be arranged without traversing the emitter electrode 52. At least one end of the beam portion may be connected to another protective layer 150 above the emitter electrode 52. In the example of FIG. 10, one end of the second beam portion configured with the protective layer 150-7, the protective layer 150-4 and the protective layer 150-7 arranged in a straight line, is connected to the protective layer 150-6 that functions as the first beam portion. The other end of the second beam portion is connected to the protective layer 150-2.

At least one of the beam portions of first beam portion and the second beam portions may be connected to the protective layer 150-3 covering the peripheral well region 113. In the example of FIG. 10, the ends of the protective layer 150-5 and the protective layer 150-6 are connected to the protective layer 150-3. At least one of the first beam portion and the second beam portion may traverse the emitter electrode 52 in a top view. In the example of FIG. 10, the protective layer 150-6 is traversing the emitter electrode 52. That is, one end of the protective layer 150-6 is connected to the protective layer 150-3 traversing the emitter electrode 52, and the other end is connected to the protective layer 150-3.

By providing at least a part of the protective layer 150 as a beam portion dividing the upper surface of the emitter electrode 52, the warping of the semiconductor substrate in the Z axis direction can be suppressed. The warping of the semiconductor substrate can be further suppressed by providing a beam portion such that it traverses the upper surface of the emitter electrode 52, as in the protective layer 150-6. Also, the warping of the semiconductor substrate 10 can be further suppressed by extending the upper surface of the emitter electrode 52 to provide a beam portion to connect the protective layers 150 together, as in the protective layer 150-7 and the protective layer 150-4.

Also, by arranging the beam portions without covering the entire upper surface of the emitter electrode 52 with the protective layer 150, it becomes easier to provide the connecting portion 162, as shown in FIG. 11, on the upper surface of the emitter electrode 52. The connecting portion 162 is connected to the connecting region that is not covered by the protective layer 150 of the upper surface of the emitter electrode 52. As described above, the connecting portion 162 may be connected to the emitter electrode 52 via the plated portion 161.

In the example of FIG. 10, the third region 152-3 functions as the connecting region. As described above, the third region 152-3, among each of the regions 152 on the upper surface of the emitter electrode 52, is the region with the largest area. The upper surface of the emitter electrode 52 may have a plurality of third regions 152-3. In this case, the connecting portion 162 may be provided in each third region 152-3. Also, each third region 152-3 may be connected by the wirings such as lead frames.

The third region 152-3 may be enclosed by the protective layer 150 including at least one first beam portion and at least one second beam portion in a top view. For example, when the third region 152-3 is rectangular, a first beam portion may be provided along at least one side of the third region 152-3 and a second beam portion may be provided along at least one of the other sides. Also, the first beam portion and the second beam portion may also be provided intersecting in a top view.

In the example of FIG. 10, the protective layer 150 enclosing the third region 152-3 includes a protective layer 150-5 and a protective layer 150-6 functioning as the first beam portion, and a protective layer 150-4 and a protective layer 150-7 functioning as the second beam portion. The protective layer 150 enclosing the third region 152-3 in this example includes a protective layer 150 other than the beam portions. In other examples, the protective layer 150 enclosing the third region 152-3 may also include the beam portions only. By enclosing the perimeter of the third region 152-3 where the connecting portion 162 is provided with the protective layer 150, the warping of the semiconductor substrate 10 due to the stress created in the third region 152-3 can be suppressed.

As illustrated in FIG. 11, herein, the protective layer 150-5 and the protective layer 150-6 that function as the first beam portion are arranged on the upper surface of the emitter electrode 52. That is, the protective layer 150-5 and the protective layer 150-6 are provided to function as the first beam portion, and are not provided to separate and insulate the emitter electrode 52. Similarly, the protective layer 150-4 and the protective layer 150-7, which function as the second beam portion, may also be arranged on the upper surface of the emitter electrode 52.

Also, the protective layer 150-1, the protective layer 150-2, and the protective layer 150-3 may be provided to insulate and separate the emitter electrode 52. That is, the protective layer 150-1, the protective layer 150-2 and the protective layer 150-3 may be provided to divide the emitter electrode 52. In addition, the protective layer 150-5 and the protective layer 150-6 that function as the first beam portion, and the protective layer 150-4 and the protective layer 150-7 that function as the second beam portions, may also be provided to divide the emitter electrode 52.

As mentioned above, by appropriately arranging the protective layer 150, bias in the position of the solder and the like on the upper surface of the semiconductor substrate can be suppressed, and the warping of the semiconductor substrate 10 can be suppressed, and a third region 152-3 to which wirings 163 such as wires or lead frames can be connected can be secured. This enables the assembling of the semiconductor device 100 to become easier.

Figure 12:
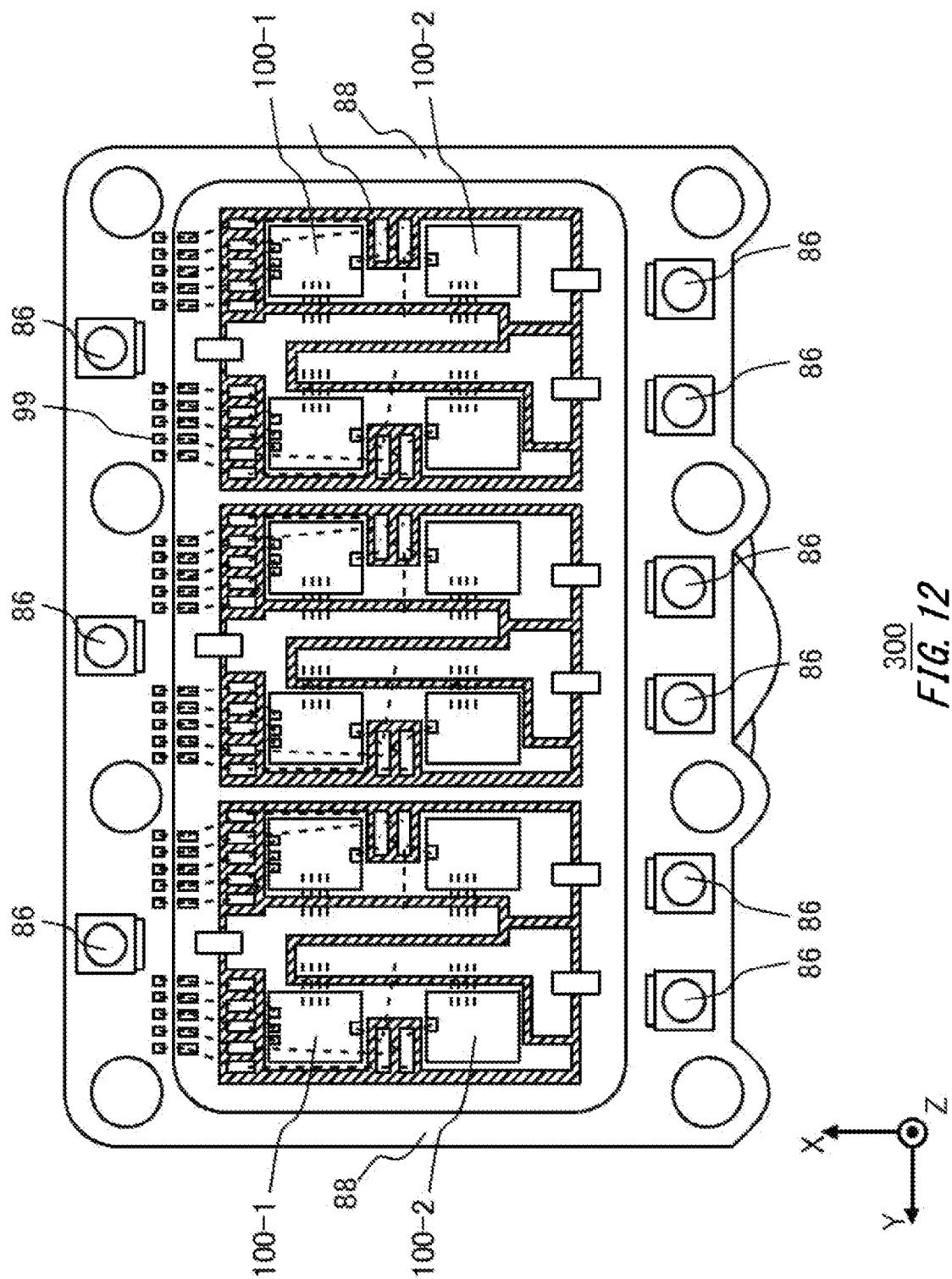
FIG. 12 illustrates a top view of one example of a semiconductor module 300 according to the embodiment of the present invention.

FIG. 12 illustrates a top view of one example of the semiconductor module 300 according to the embodiment of the present invention. The semiconductor module 300 includes the first semiconductor device 100-1 and the second semiconductor device 100-2. The semiconductor module 300 may include multiple sets of the first semiconductor devices 100-1 and the second semiconductor devices 100-2.

The semiconductor module 300 of this example includes a housing 88. The housing 88 houses the respective semiconductor devices 100. A refrigerant that cools the semiconductor device 100 flows in the interior of the housing 88. The second semiconductor device 100-2 is arranged upstream of the refrigerant flow path than the first semiconductor device 100-1. That is, the refrigerant that passed through the vicinity of the second semiconductor device 100-2 passes through the vicinity of the first semiconductor device 100-1. Thus, the cooling efficiency of the first semiconductor device 100-1 may be deteriorated compared to the cooling efficiency of the second semiconductor device 100-2.

The second semiconductor device 100-2 is the semiconductor device 100 described in FIG. 1 to FIG. 11. The first semiconductor device 100-1 includes at least one of a temperature sensor and a current sensor, in addition to the configuration of the semiconductor device 100 described in FIG. 1 to FIG. 11. The semiconductor module 300 controls both of the first semiconductor device 100-1 and the second semiconductor device 100-2, based on the detection result of the temperature sensor and the current sensor of the first semiconductor device 100-1. For example, when overheating is detected in the first semiconductor device 100-1, the semiconductor module 300 suppresses the output current of the first semiconductor device 100-1 and the second semiconductor device 100-2. By using the detection results of the sensors of the first semiconductor device 100-1, which has poor cooling efficiency, overheating and other problems in the first semiconductor device 100-1 can also be suppressed.

In this case, by using the semiconductor device 100 as the second semiconductor device 100-2, the manufacturing cost of the second semiconductor device 100-2 can be reduced. Also, by having the structure described in FIG. 1 to FIG. 11, the performance of the second semiconductor device 100-2, such as the withstand capability, can be maintained at the same level as the first semiconductor device 100-1.

The housing 88 includes a main terminal 86 and a control terminal 99. At least a part of the main terminal 86 is electrically connected to the emitter electrode 52 of the semiconductor device 100. At least a part of the control terminal 99 is electrically connected to the pad 50 of the semiconductor device 100. Also, at least a part of the control terminal 99 is electrically connected to the sensor of the first semiconductor device 100-1.

Figure 13:
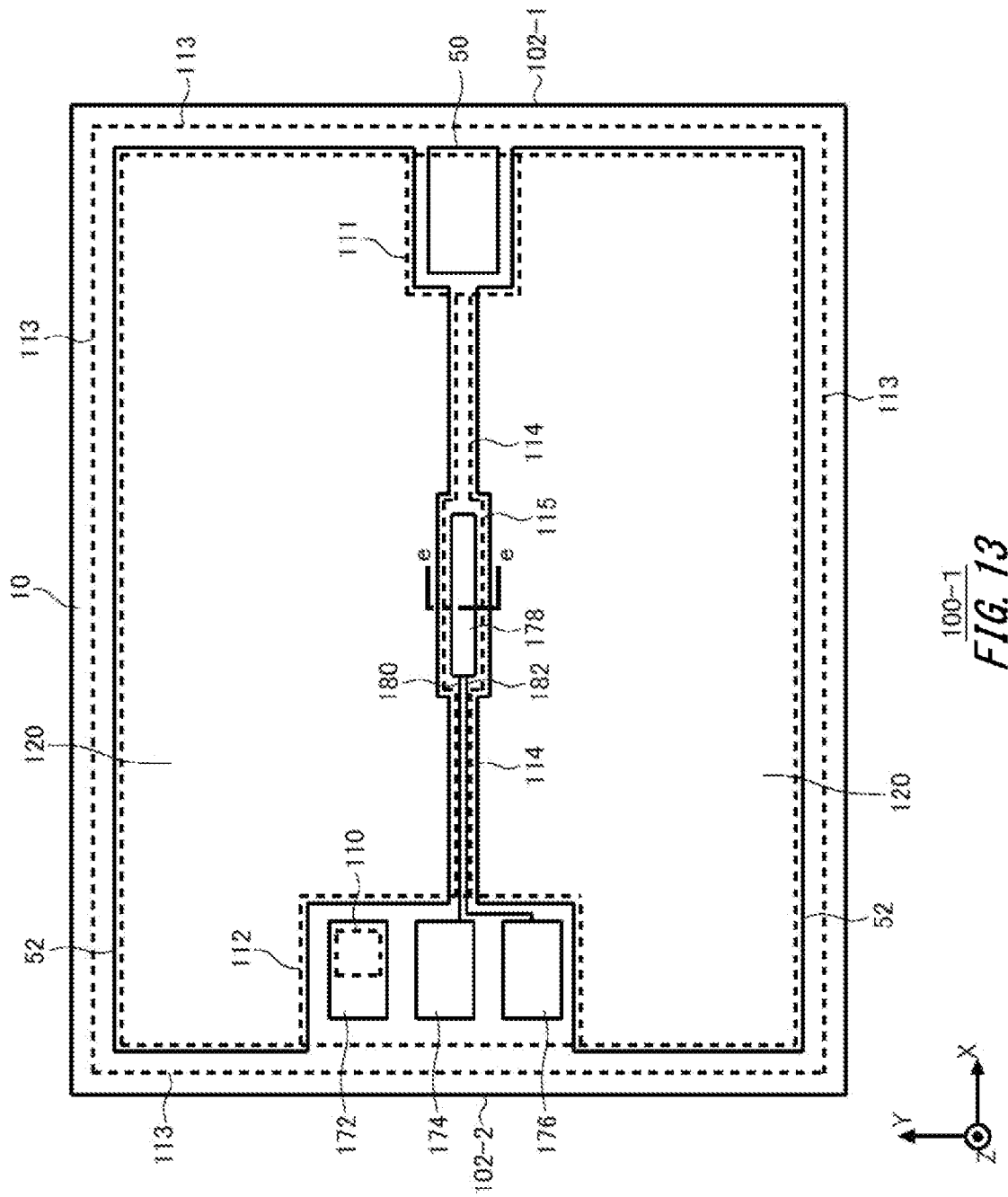
FIG. 13 illustrates one example of the upper surface of a first semiconductor device 100-1.

FIG. 13 illustrates one example of the upper surface of the first semiconductor device 100-1. The first semiconductor device 100-1 has a temperature sensor 178, an anode wiring 180, a cathode wiring 182, an anode pad 174, a cathode pad 176, and a current detection pad 172, in addition to the configuration of the semiconductor device 100 described in FIG. 1 to FIG. 11. Also, the dummy element portion 110 functions as a current sensor. In FIG. 13, the pad 50 is one example of the first pad, and the anode pad 174, the cathode pad 176 and the current detection pad 172 are respectively one example of the second pad. Also, the emitter electrode 52 is provided for each divided region of the active portion 120. Each pad is provided to be separated from the emitter electrode 52.

The anode pad 174, the cathode pad 176 and the current detection pad 172 are arranged above the second well region 112. The current detection pad 172 is connected with the mesa portion 60 of the dummy element portion 110. The anode pad 174 is connected to the anode of the temperature sensor 178 by the anode wiring 180. The cathode pad 176 is connected to the cathode of the temperature sensor 178 by the cathode wiring 182.

The anode wiring 180 and the cathode wiring 182 are arranged above the dividing well region 114. The anode wiring 180 and the cathode wiring 182 may be metal wirings such as aluminum.

The temperature sensor 178 is arranged above the wide portion 115. The entire temperature sensor 178 may overlap the wide portion 115. The temperature sensor 178 of this example is a PN junction diode formed of semiconductor materials such as polysilicon.

Figure 14:
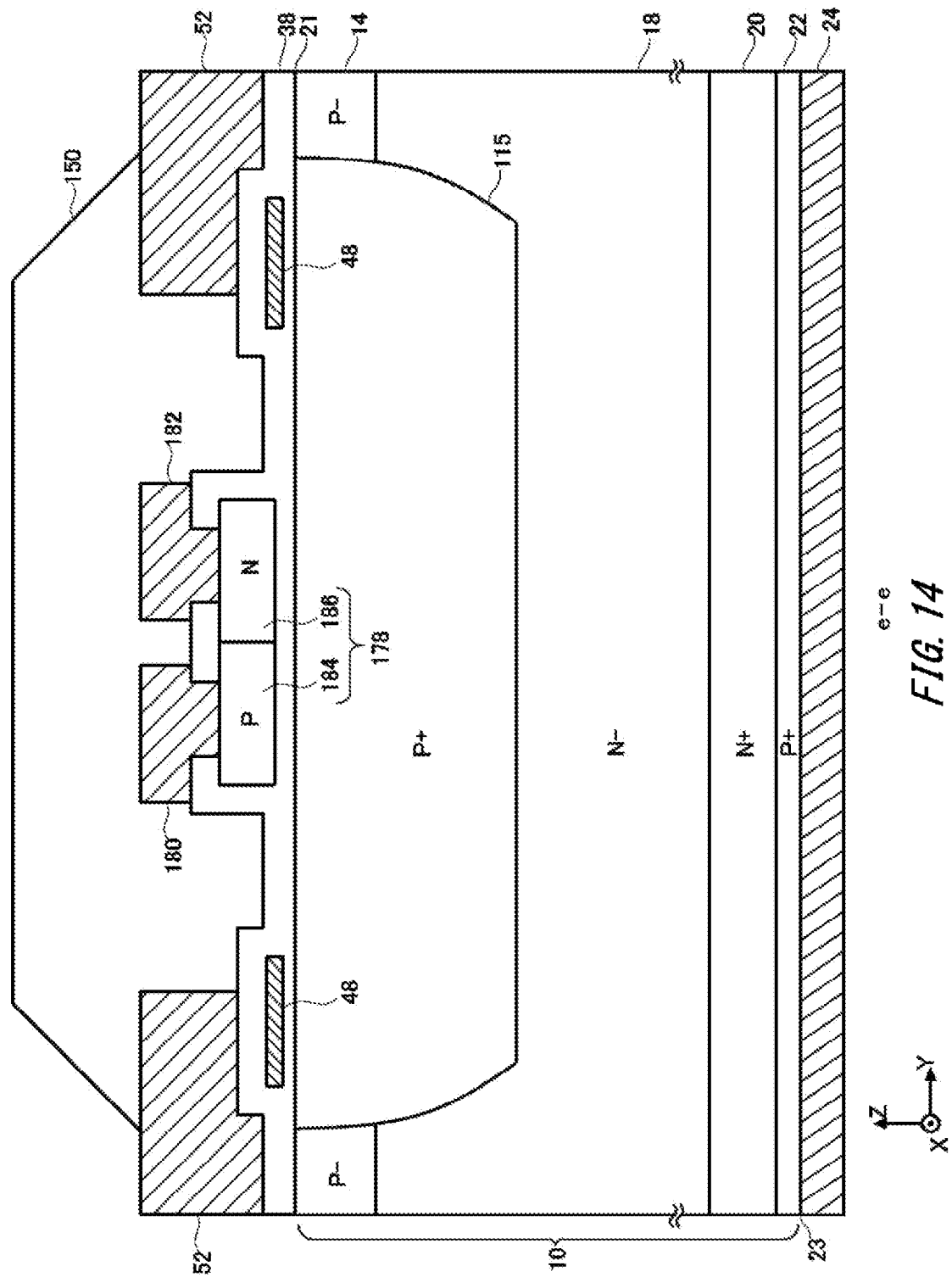
FIG. 14 illustrates one example of a cross section taken along e-e in FIG. 13.

FIG. 14 illustrates one example of a cross section taken along e-e in FIG. 13. The cross section differs from the cross section shown in FIG. 9 in that the temperature sensor 178, the anode wiring 180 and the cathode wiring 182 are provided. Also, the emitter electrode 52 is divided by the temperature sensor 178, the anode wiring 180 and the cathode wiring 182 in the Y axis direction.

The temperature sensor 178 has an anode 184 and a cathode 186. The anode 184 of this example is a P type polysilicon doped with impurities. The cathode 186 of this example is an N type polysilicon doped with impurities. The anode wiring 180 is connected to the anode 184, and the cathode wiring 182 is connected to the cathode 186. The temperature of the temperature sensor 178 can be estimated from the voltage applied to temperature sensor 178 and the current flowing through the temperature sensor 178.

Figure 15:
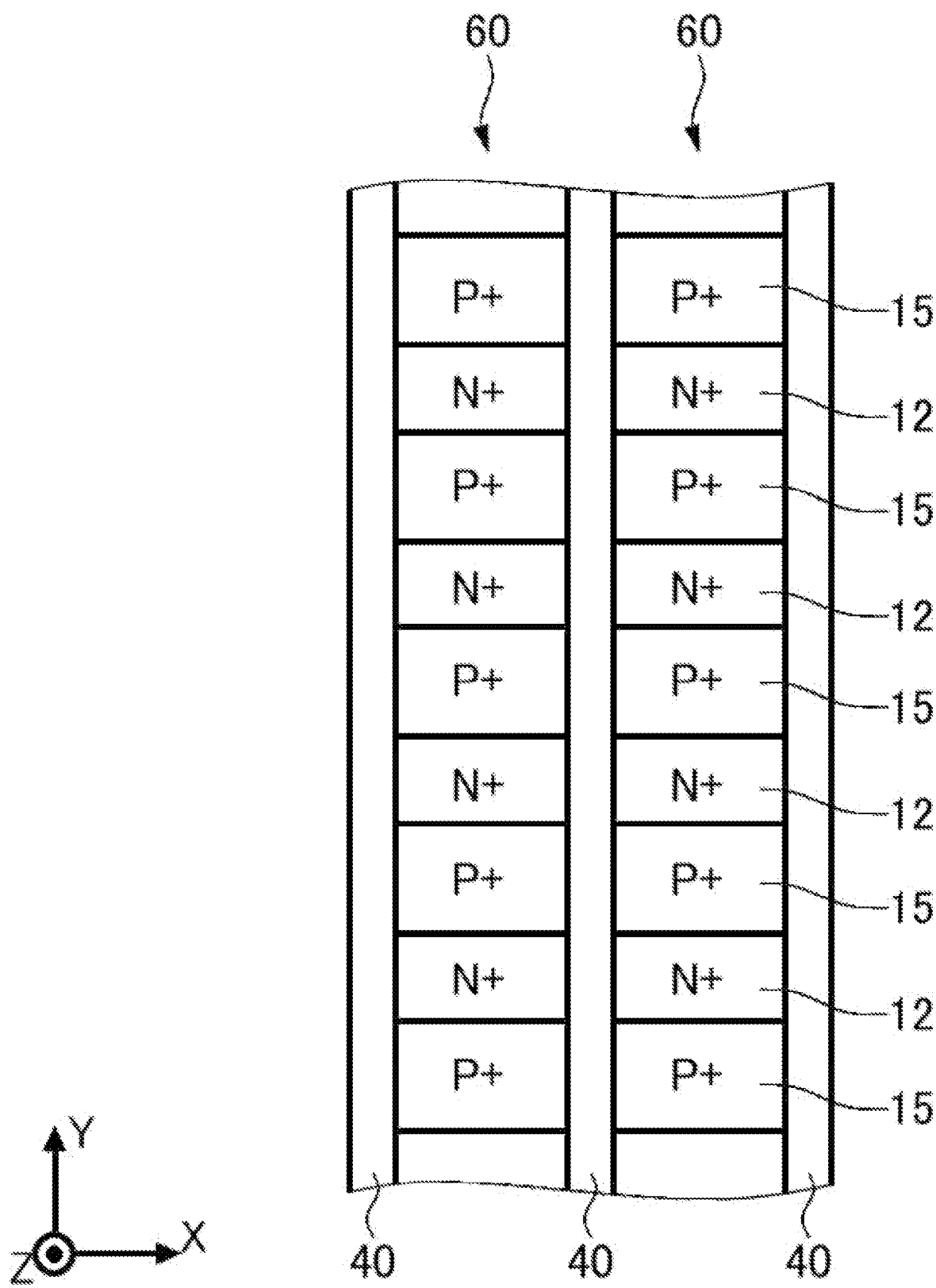
FIG. 15 illustrates a top view of the mesa portion 60 of a dummy element portion 110 of the first semiconductor device 100-1.

FIG. 15 illustrates a top view of the mesa portion 60 of the dummy element portion 110 of the first semiconductor device 100-1. Emitter regions 12 in contact with the gate trench portions 40 are provided in the mesa portion 60. Thereby, the dummy element portion 110 operates as a transistor. By detecting the current flowing through the dummy element portion 110, the current flowing through the active portion 120 can be estimated.

According to the semiconductor device 100 described in FIG. 1 to FIG. 11, the area of the active portion 120 of the second semiconductor device 100-2 can be the same as that of the first semiconductor device 100-1. Also, the gate capacitance of the second semiconductor device 100-2 can be the same as that of the first semiconductor device 100-1. Also, the withstand capability of the second semiconductor 100-2 can be achieved to be the same as that of the first semiconductor device 100-1. Also, the manufacturing process of the first semiconductor device 100-1 can be partially shared with the manufacturing process of the second semiconductor device 100-2. This enables the manufacturing cost of the semiconductor device to be reduced. Also, by partially sharing the manufacturing process of the semiconductor devices, the assembling of semiconductor devices can become easier.

Figure 16:
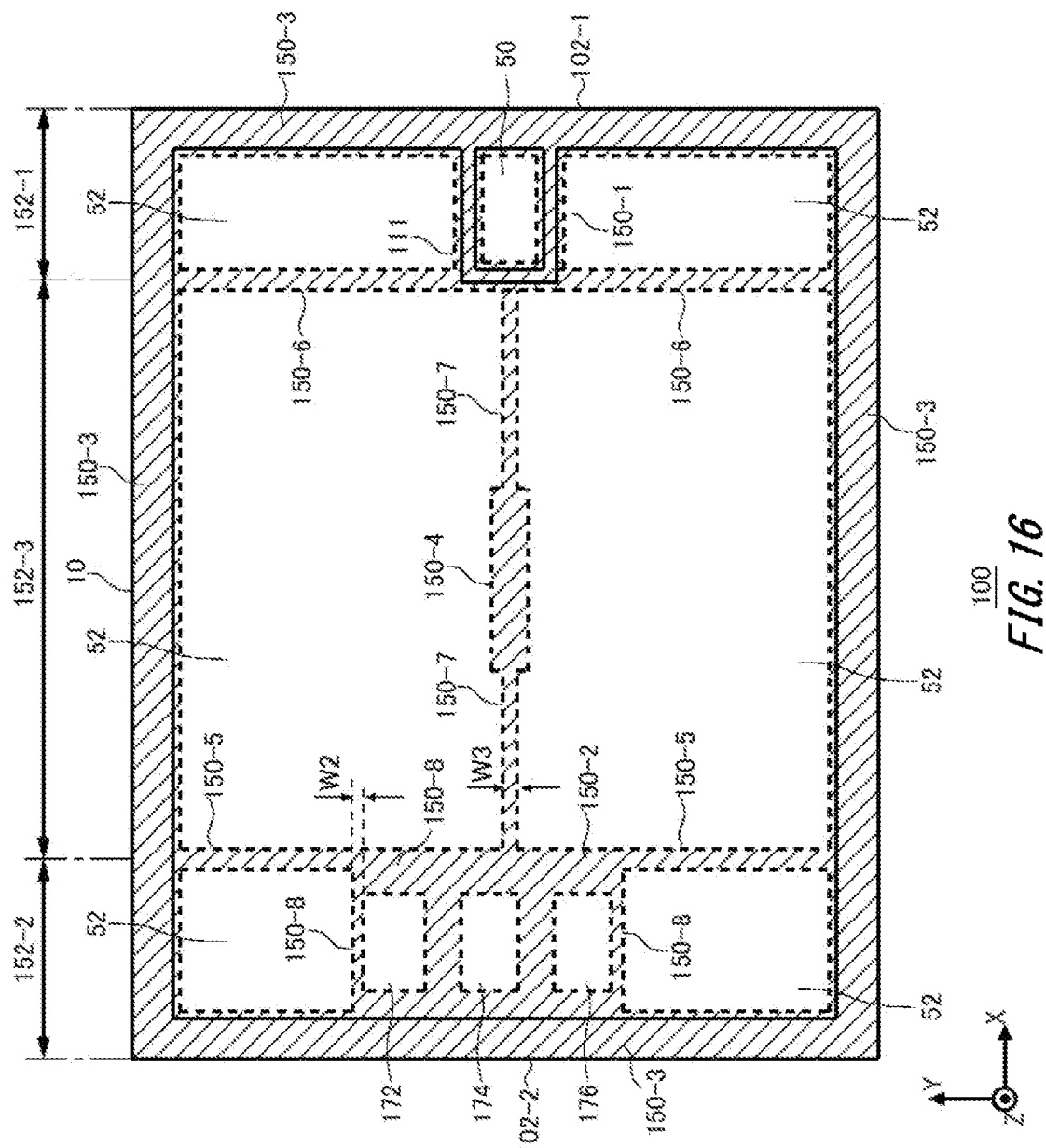
FIG. 16 illustrates another exemplary arrangement of the protective layer 150 in a top view.

FIG. 16 illustrates another exemplary arrangement of the protective layer 150 in a top view. The semiconductor device 100 has a pad arranged above the semiconductor substrate 10 and separated from the emitter electrode 52. The semiconductor device 100 of this example has the same electrode arrangement as the semiconductor device 100 described in FIG. 13. That is, the semiconductor device 100 has a current detection pad 172, an anode pad 174 and a cathode pad 176, which are separated from the emitter electrode 52.

When there are one or more pads, there is an aperture provided to expose the upper surface of each pad on the protective layer 150. In this example, on the protective layer 150-2, apertures are provided for each pad of the current detection pad 172, the anode pad 174 and the cathode pad 176. The protective layer 150 has an electrode separating portion provided between each pad and the emitter electrode 52 in a top view. In the example of FIG. 16, the protective layer 150-8 functions as an electrode separating portion.

The width of the protective layer 150 (protective layer 150-8 in this example) that functions as the electrode separating portion is taken as W2. The width W2 refers to the minimal width of the widths of the electrode separating portion in a top view. Additionally, the width of the protective layer 150 (the protective layer 150-4, the protective layer 150-5, the protective layer 150-6 and the protective layer 150-7 in this example) that functions as the beam portion is taken as W3. The width W3 refers to the minimal width of the widths of the beam portion in a top view. In the example of FIG. 16, the width of the protective layer 150-7 is taken as W3, but the width of the other protective layer 150, which functions as the beam portion, may also be W3.

In this example, the width W3 is greater than the width W1. By increasing the width of the beam portion, the warping of the semiconductor substrate 10 can be easier to be suppressed. In addition, by reducing the width of the electrode separating portion, the exposed area of the upper surface of the pad, which is smaller than that of the emitter electrode 52, can be secured, making it easier to connect the wiring to each pad.

The width W3 may be 100 μm or more, may be 200 μm or more, or may be 300 μm or more. The width W3 may also be equal to or greater than the thickness of the semiconductor substrate 10 in the Z axis direction.

Herein, the protective layer 150-5 and the protective layer 150-6, which function as the first beam portion, are arranged on the upper surface of the emitter electrode 52. On the other hand, the protective layer 150-4 and the protective layer 150-7, which function as the second beam portion, are provided to divide the emitter electrode 52. That is, the protective layer 150-4 and the protective layer 150-7 are provided to perform both of a function as the second beam portion and a function of insulating separating.

Figure 17:
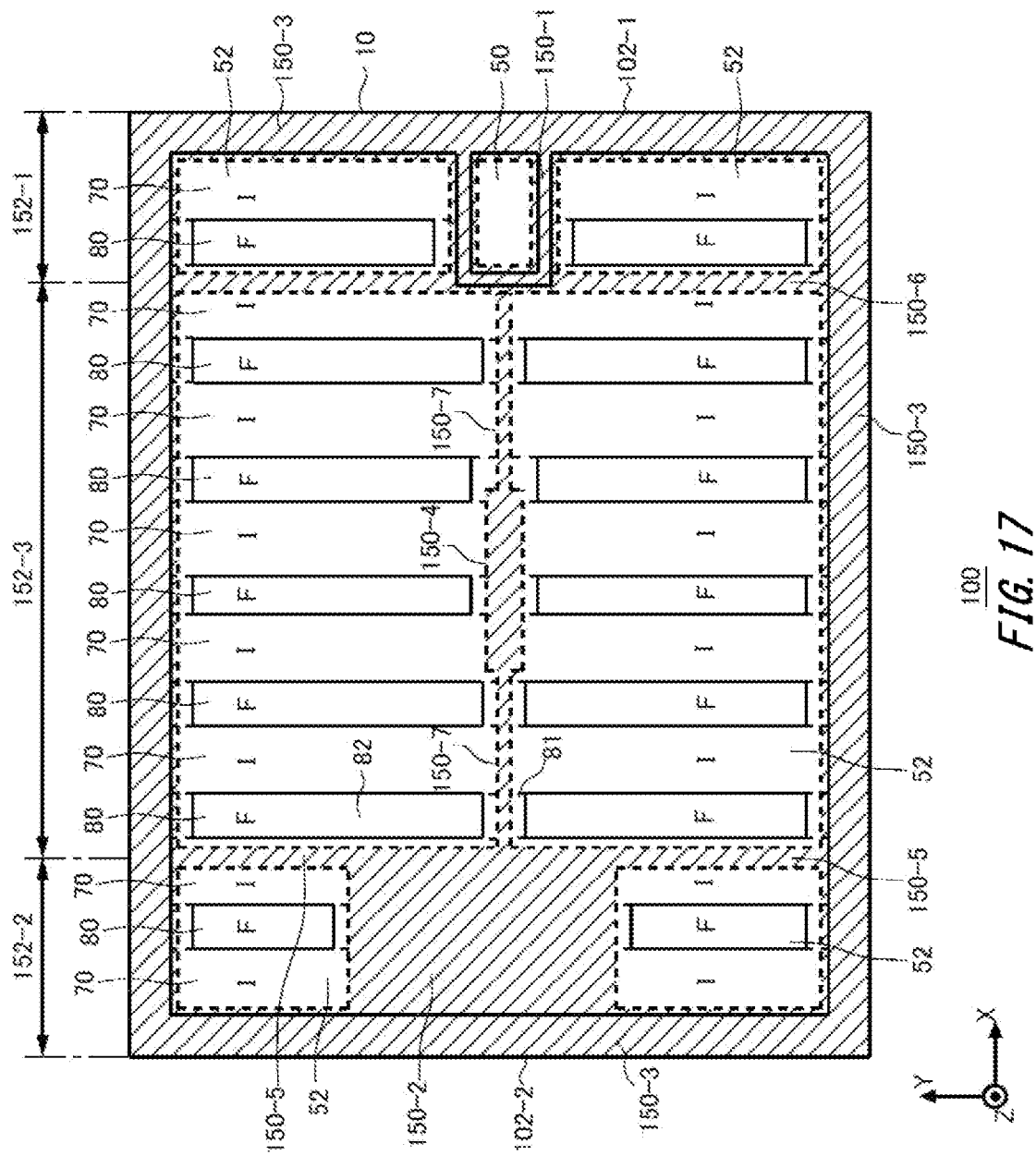
FIG. 17 illustrates an exemplary arrangement of the transistor portion 70, the diode portion 80 and the protective layer 150 on the upper surface of the semiconductor device 100.

FIG. 17 illustrates an exemplary arrangement of the transistor portion 70, the diode portion 80 and the protective layer 150 on the upper surface of the semiconductor device 100. The arrangement of the transistor portion 70 and the diode portion 80 may be the same as the example of FIG. 3. The transistor portion 70 has a collector region 22 in contact with the lower surface 23 of the semiconductor substrate 10. The diode portion 80 has a cathode region 82 in contact with the lower surface 23 of the semiconductor substrate 10.

The solid rectangle enclosing the sign "F" in FIG. 17 illustrates the region where the cathode region 82 is provided. On the lower surface 23 of the semiconductor substrate 10, a collector region 22 is provided in a region other than the cathode region 82. The diode portion 80 is the region where the cathode region 82 is provided in a top view. In FIG. 17, the region extending each cathode region 82 to the well region 11 (refer to FIG. 10, etc.) in the Y axis direction is taken as an extending region 81. In this specification, the region where the extending region 81 is provided is also included in a diode portion 80 in a top view.

In this example, the first beam portion (the protective layer 150-5 and the protective layer 150-6 in this example) having a longitudinal length in the Y axis direction is provided at a position that does not overlap the cathode region 82 in a top view. The first beam portion may be provided at a position that does not overlap the diode portion 80. In the example of FIG. 17, the first beam portion is provided at a position that overlaps the transistor portion 70. The longitudinal directions of the first beam portion and the transistor portion 70 (the Y axis direction in this example) may be the same. In addition, any protective layer 150 is preferably not provided at the position that overlaps the cathode region 82.

Figure 18:
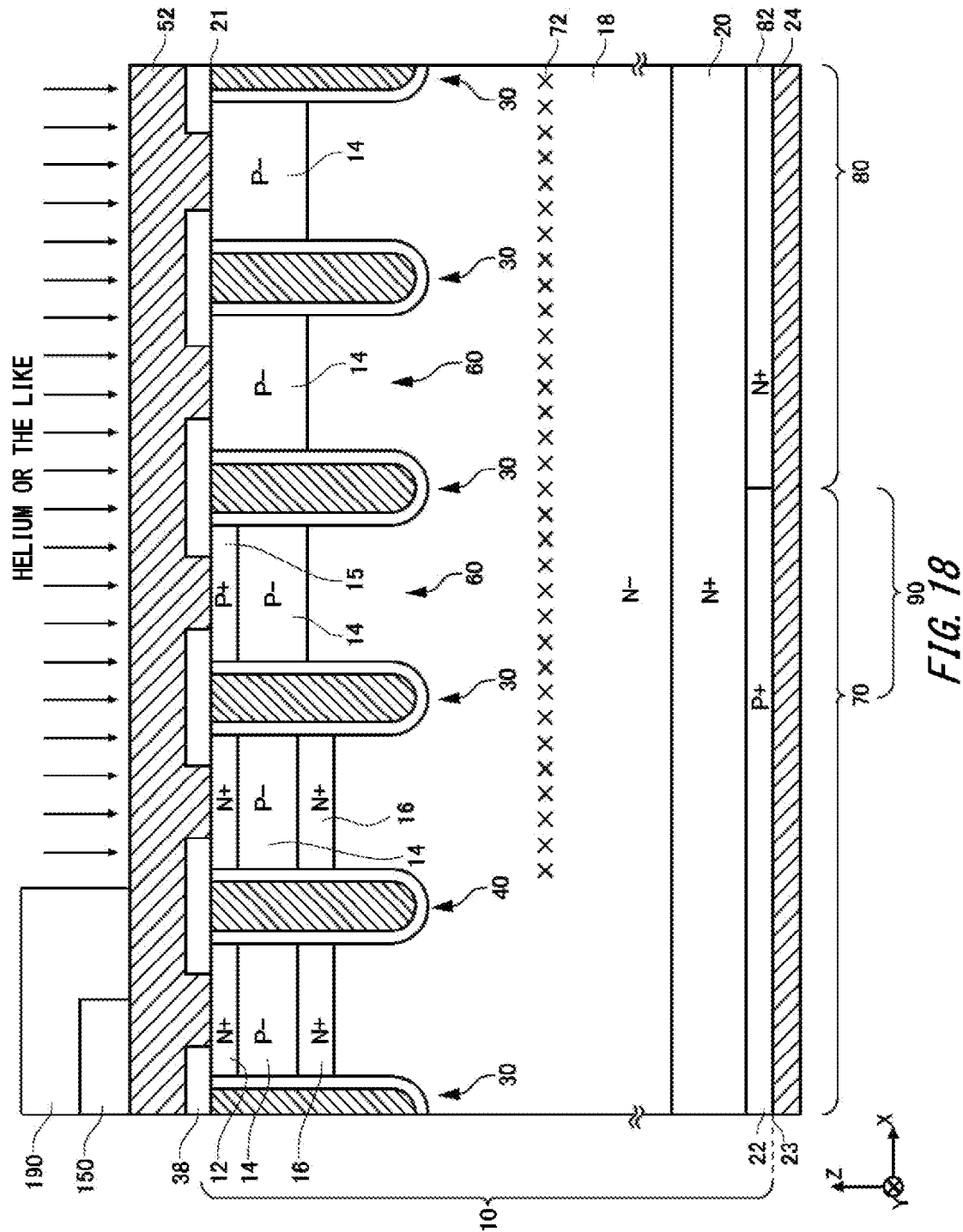
FIG. 18 illustrates one example of a XZ cross section of the semiconductor device 100.

FIG. 18 illustrates one example of a XZ cross section of the semiconductor device 100. The semiconductor device 100 of this example has a lifetime adjustment region 72, in addition to the structures of the semiconductor device 100 described in FIG. 1 to FIG. 17. The other structures are the same as described in FIG. 1 to FIG. 17. However, the arrangement of the protective layer 150 is the same as illustrated in FIG. 17.

The lifetime adjustment region 72 is provided on the upper surface 21 side of the semiconductor substrate 10. The upper surface 21 side refers to the region between the center of the depth direction of the semiconductor substrate 10 and the upper surface 21. The lifetime adjustment region 72 includes a lifetime killer such as a vacancy defect caused by implantation of particles such as helium or hydrogen from the upper surface 21 of the semiconductor substrate 10. In FIG. 18, the position of the implantation depth of the particles is illustrated by a × mark. The distribution of the lifetime killer density in the depth direction has a peak at the particle implantation position. The lifetime killer may be distributed from the particle implantation position to the upper surface 21, as vacancy defects and the like occur in the region through which the particles have passed. The change in lifetime killer density may be more gradual in the distribution from the peak position towards the upper surface 21 than in the distribution from the peak position towards the lower surface 23. Also, the distribution of the particle concentration of helium and other particles in the depth direction has a peak at the particle implantation position.

In the process of implanting particles such as helium, a mask 190 is provided in the region where the particles are not implanted. The mask 190 is formed of a material and thickness capable of shielding the particles. The mask 190 may be formed of a resist, may be formed of a metal, or may also be formed of other materials.

A diode portion 80 is provided in the lifetime adjustment region 72. This enables the lifetime of the carrier of the diode portion 80 during the reverse recovery of the diode portion 80 to be shorter, so that the reverse recovery characteristics can be improved. The lifetime adjustment region 72 may also be provided in the intermediate region 90. By providing the lifetime adjustment region 72 in the intermediate region 90, the flowing of the carrier from the transistor portion 70 to the diode portion 80 can be suppressed.

In this example, the protective layer 150 is not provided at a position overlapping the cathode region 82 and is arranged above the transistor portion 70. This prevents the depth position of implantation of particles such as helium in the diode portion 80 from fluctuating due to the protective layer 150.

The protective layer 150 is preferably provided in a range that does not overlap with the lifetime adjustment region 72. This enables a more accurate control of the depth position of the lifetime adjustment region 72. The protective layer 150 may also be covered by the mask 190.

In addition, when there is a cathode region 82 that does not function as a part of the diode portion 80, a protective layer 150 may also be provided above the cathode region 82. The cathode region 82 that does not function as a part of the diode portion 80 is, for example, the cathode region 82 where the emitter electrode 52 is not arranged on the upper surface 21. That is, the cathode region 82 that does not overlap with the emitter electrode 52 in a top view, may not function as a part of the diode portion 80. As one example, the cathode region 82 provided in the region other than the active portion 120 may also be taken as the cathode region 82 that does not function as a part of the diode portion 80. For example, even if a cathode region 82 is provided in the edge termination structure portion between the peripheral well region 113 and the end side of the semiconductor substrate 10, a protective layer 150 may be provided in the edge termination structure portion.

Figure 19:
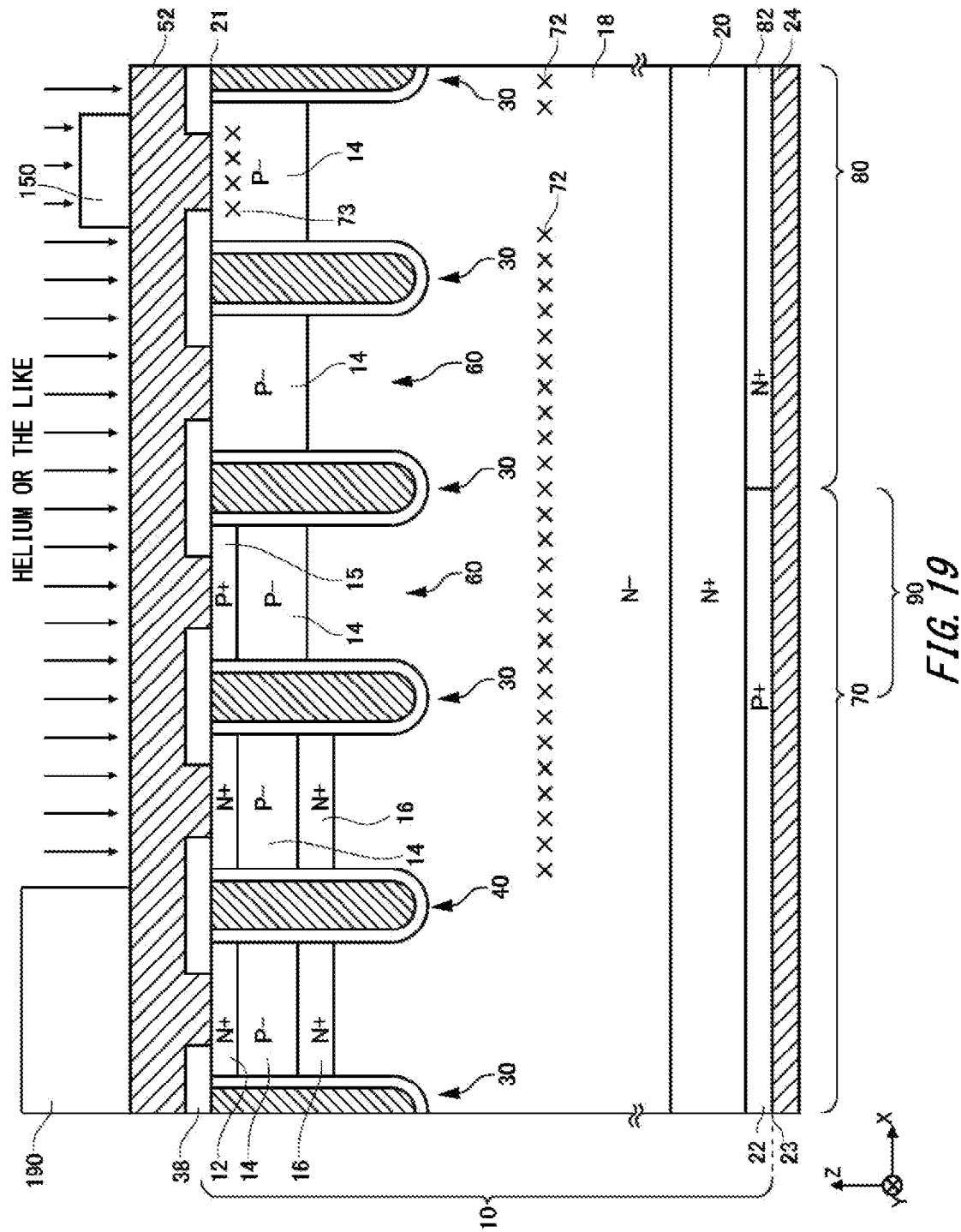
FIG. 19 illustrates a cross section of the semiconductor device 100, in which the protective layer 150 is provided in the diode portion 80.

FIG. 19 illustrates a cross section of the semiconductor device 100 in which a protective layer 150 is provided in the diode portion 80. If a protective layer 150 is provided in the diode portion 80, the particles such as helium are slowed down by the protective layer 150. Thereby, a lifetime killer 73 may be formed at a position different from the lifetime adjustment region 72. In this case, the characteristics of the diode portion 80 can not be accurately controlled. In the example illustrated in FIG. 18, as the depth position of the lifetime killer can be accurately controlled, the characteristics of the diode portion 80 can be accurately controlled.

FIG. 20 illustrates a top view of another exemplary arrangement of the protective layer 150. In FIG. 20, the protective layers 150 other than the protective layer 150-9 that functions as the first beam portion, and the protective layer 150-10 that functions as the second beam portions, are omitted. Also, the structures other than the schematic active portion 120, semiconductor substrate 10 and protective layer 150 are also omitted. The structures other than the active portion 120, the semiconductor substrate 10 and the protective layer 150 are the same as any form described in FIG. 1 to FIG. 19.

The protective layer 150-9 and the protective layer 150-10 of this example may have longitudinal lengths in directions that are different from the longitudinal direction of the transistor portion 70 (for example, the Y axis direction). The protective layer 150-9 and the protective layer 150-10 may have longitudinal lengths in directions that are different from the extending direction of each trench portion. The protective layer 150-9 and the protective layer 150-10 may have longitudinal lengths in directions that are different from the end side 102 of semiconductor substrate 10. The fourth region 152-4 on the upper surface of the emitter electrode 52 may be enclosed by two protective layers 150-9 and two protective layers 150-10. A connecting portion 162 illustrated in FIG. 11 may be provided in the fourth region 152-4. The warping of the semiconductor substrate can also be suppressed by such a structure.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate, 11: well region, 12: emitter region, 14: base region, contact region, 16: accumulation region, 18: drift region, 20: buffer region, 21: the upper surface, 22: collector region, 23: the lower surface, 24: collector electrode, 25: connecting portion, 29: extending portion, 30: dummy trench portion, 31: edge portion, 32: dummy insulating film, 34: dummy conductive portion, 38: interlayer dielectric film, 39: extending portion, 40: gate trench portion, 41: edge portion, 42: gate insulating film, 44: gate conductive portion, 48: gate runner, 50: pad, 52: emitter electrode, 54: contact hole, 56: contact hole, 60: mesa portion, 70: transistor portion, 72: lifetime adjustment region, 73: lifetime killer, 80: diode portion, 81: extending region, 82: cathode region, 86: main terminal, 88: housing, 90: intermediate region, 99: control terminal, 100: semiconductor device, 102: end side, 110: dummy element portion, 111: the first well region, 112: the second well region, 113: peripheral well region, 114: dividing well region, 115: wide portion, 120: active portion, 150: protective layer, 152-1: the first region, 152-2: the second region, 152-3: the third region, 160: connecting portion, 161: plated portion, 162: connecting portion, 163: wiring, 172: current detection pad, 174: anode pad, 176: cathode pad, 178: current sensor, 180: anode wiring, 182: cathode wiring, 184: anode, 186: cathode, 190: mask, 200: packaging substrate, 300: semiconductor module

What is claimed is:

1. A semiconductor device, comprising:
    a semiconductor substrate that has, in a top view, one set of first end sides facing each other in a first direction and one set of second end sides facing each other in a second direction;
    a first electrode that is provided above the semiconductor substrate and configured with metal;
    one or more pads that are provided to be separated from the first electrode above the semiconductor substrate and configured with metal; and
        a beam portion that is provided above the semiconductor substrate, and is configured with an insulating material, wherein
    the beam portion has
        a peripheral beam portion that is provided along the first end sides and the second end sides,
        at least one first beam portion that extends in the second direction and adjacently past the one or more pads, one end and other end of the at least one beam portion being connected to the peripheral beam portion, and
        at least one second beam portion that extends in the first direction.

2. The semiconductor device according to claim 1, wherein at least one end of the second beam portion is connected to the first beam portion.

3. The semiconductor device according to claim 1, wherein the first beam portion is provided above the first electrode.

4. The semiconductor device according to claim 1, wherein
    the one or more pads include a gate pad, and
    the first beam portion extends adjacently past the gate pad.

5. The semiconductor device according to claim 1, comprising
    a gate runner connected to the gate pad, wherein
    the second beam portion is provided above the gate runner.

6. The semiconductor device according to claim 1, wherein
    the beam portion has a width equal to or greater than a thickness of the semiconductor substrate.

7. The semiconductor device according to claim 1, wherein the second beam portion extends in the second direction in substantially-center positions of the first end sides.

8. The semiconductor device according to claim 1, comprising a temperature sensor that is provided above the semiconductor substrate, wherein
    the second beam portion is provided above the temperature sensor.

9. The semiconductor device according to claim 8, comprising a wiring that connects the temperature sensor and the pad, wherein
    the second beam portion is provided above the wiring.

10. The semiconductor device according to claim 1, wherein the one or more pads include a current detection pad and a temperature detection pad, wherein
    the first beam portion extends adjacently past the current detection pad and the temperature detection pad.

11. The semiconductor device according to claim 1, wherein
    the first electrode has an emitter potential, and
    the first beam portion is provided between a plurality of the first electrodes in the first direction, in a top view.

12. The semiconductor device according to claim 1, wherein
    the first electrode has an emitter potential, and
    the second beam portion is provided between a plurality of the first electrodes in the second direction, in a top view.

13. The semiconductor device according to claim 1, wherein
    the first electrode has an emitter potential, and
    the first beam portion and the second beam portion divide an upper surface of the first electrode into a plurality of regions.

14. The semiconductor device according to claim 13, comprising
    a plated portion that is provided above a region having a largest area among the plurality of regions.

15. The semiconductor device according to claim 1, comprising
    a plated portion that is provided adjacent to the first beam portion.

16. The semiconductor device according to claim 1, wherein
    the beam portion includes a polyimide.

17. The semiconductor device according to claim 1, wherein
    the semiconductor substrate includes
        a transistor portion that has a collector region, and
        a diode portion that has a cathode region, wherein
    the first beam portion is provided above the transistor portion.

18. The semiconductor device according to claim 1, wherein
    the semiconductor substrate is one of a silicon substrate, a silicon carbide substrate or a nitride semiconductor substrate.

19. The semiconductor device according to claim 1, comprising:
    a gate pad, as one of the one or more pads that is provided on a side of one end side among the first end sides;
    a current detection pad and a temperature detection pad, as ones of the one or more pads that are provided on a side of other end side among the first end sides, and
    at least two of the at least one first beam portion are provided, one extending adjacently past the gate pad, other one extending adjacently past the current detection pad and the temperature detection pad.

20. The semiconductor device according to claim 19, wherein
    one end and other end of the second beam portion are connected to the first beam portion.

* * * * *